US012731923B2

(12) United States Patent
Critz et al.

(10) Patent No.: US 12,731,923 B2
(45) Date of Patent: Sep. 8, 2026

(54) SYSTEMS AND METHODS TO DIAGNOSE CONNECTIVITY OF A NON-SOLDERED COMPRESSION USB CONNECTOR

(71) Applicant: Dell Products L.P., Round Rock, TX (US)

(72) Inventors: Christian L. Critz, Liberty Hill, TX (US); Ernesto Ramirez, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 342 days.

(21) Appl. No.: 18/391,825

(22) Filed: Dec. 21, 2023

(65) Prior Publication Data

US 2025/0210891 A1 Jun. 26, 2025

(51) Int. Cl.
*H01R 12/70* (2011.01)
*G01R 31/70* (2020.01)
*H01R 12/72* (2011.01)

(52) U.S. Cl.
CPC ......... *H01R 12/7047* (2013.01); *G01R 31/70* (2020.01); *H01R 12/722* (2013.01)

(58) Field of Classification Search
CPC .... H01R 13/73; H01R 13/745; H01R 13/748; H01R 13/78; H01R 12/7047; H01R 12/722; G01R 31/70
USPC ......... 439/81, 79, 570, 563, 573, 541.5, 569
See application file for complete search history.

(56) References Cited

U.S. PATENT DOCUMENTS 6,866,524 B2 * 3/2005 Takata ............... H01R 43/0256 439/573
7,850,465 B1 * 12/2010 Wan .................. H01R 13/6473 439/83
9,930,796 B2 * 3/2018 Fantin .................... H05K 1/181
11,764,534 B2 * 9/2023 Li .......................... H01R 43/18 439/676
2017/0020011 A1 * 1/2017 Fantin ...................... G07C 5/02
2024/0364030 A1 * 10/2024 Eddings ............... H01R 12/716

FOREIGN PATENT DOCUMENTS

EP 3117491 B1 * 5/2018 ......... H01R 13/6658
WO WO-2015136496 A1 * 9/2015 ............. H01R 12/57

OTHER PUBLICATIONS

Richard Eddings, et al., "Highly Repairable, Non-Soldered USB Connector," U.S. Appl. No. 18/308,745, filed Apr. 28, 2023.

* cited by examiner

*Primary Examiner* — Gary F Paumen

(74) *Attorney, Agent, or Firm* — Fogarty LLP

(57) ABSTRACT

Embodiments of systems and methods to diagnose connectivity of a non-soldered compression Universal Serial Bus (USB) connector are described. In some non-limiting embodiments, a USB connector assembly includes: a mounting bracket configured to removably attach to a printed circuit board (PCB); and a plurality of diagnostic contacts disposed at least in part within the mounting bracket, where the diagnostic contacts are configured to electrically connect to corresponding ones of a plurality of electrical diagnostic contact pads of the PCB, where an individual diagnostic contact of the plurality of diagnostic contacts applies a force to a corresponding one of the electrical diagnostic contact pads of the PCB when the mounting bracket is mated to the PCB, and where the diagnostic contacts are part of a conductivity path of a diagnostic circuit when the mounting bracket is mated to the PCB.

19 Claims, 27 Drawing Sheets

410
400
430

SYSTEMS AND METHODS TO DIAGNOSE CONNECTIVITY OF A NON-SOLDERED COMPRESSION USB CONNECTOR

FIELD

This disclosure relates generally to Information Handling Systems (IHSs), and more specifically, to systems and methods to diagnose connectivity of a non-soldered compression Universal Serial Bus (USB) connector.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Nowadays, users can choose among many different types of IHS devices. Each type of device (e.g., tablets, 2-in-1s, mobile workstations, notebooks, netbooks, ultra-books, etc.) has unique portability, performance, and usability features; however, each also has its own trade-offs and limitations. For example, tablets have less compute power than notebooks and workstations, while notebooks and workstations lack the portability of tablets. A conventional 2-in-1 device combines the portability of a tablet with the performance of a notebook, but with a small display—an uncomfortable form factor in many use-cases.

USB connectors are or can be used for both high-speed data and power delivery in the many different types of IHS devices, including tablets, 2-in-1s, workstations, mobile workstations, notebooks, netbooks, ultra-books, etc. USB connectors are mostly soldered directly to printed circuit boards (PCBs). The few designs that are not directly soldered utilize large, more complex and more costly "off-PCB" solutions, both making repair or replacement of these USB connectors complex and costly.

SUMMARY

Embodiments of systems and methods to diagnose connectivity of a non-soldered compression Universal Serial Bus (USB) connector are described. In an illustrative, non-limiting embodiment, a USB connector assembly includes: a mounting bracket configured to removably attach to a printed circuit board (PCB); and a plurality of diagnostic contacts disposed at least in part within the mounting bracket, where the diagnostic contacts are configured to electrically connect to corresponding ones of a plurality of electrical diagnostic contact pads of the PCB, where an individual diagnostic contact of the plurality of diagnostic contacts applies a force to a corresponding one of the electrical diagnostic contact pads of the PCB when the mounting bracket is mated to the PCB, and where the diagnostic contacts are part of a conductivity path of a diagnostic circuit when the mounting bracket is mated to the PCB.

In some embodiments, the diagnostic contacts are diagnostic surface pads. In some embodiments, the diagnostic surface pads are outer rear standoff diagnostic surface pads. In some embodiments, diagnostic contacts are diagnostic leaf-springs. In some embodiments, the diagnostic leaf-springs are laser-welded to the mounting bracket. In some embodiments, the USB connector assembly includes a Type-C compression USB connector assembly, where the diagnostic contacts are outer back row extra diagnostic contacts. In some embodiments, at least one of the outer back row extra diagnostic contacts forms a conductivity path with a Type-C ground contact, in the A1 or A12 position, of the Type-C compression USB connector assembly. In some embodiments, the conductivity path of the diagnostic circuit allows for a connectivity determination of the mounting bracket to the PCB.

In some embodiments, the USB connector assembly further includes: a host USB connector port coupled to the mounting bracket and configured to accept a peripheral USB connector plug. In some embodiments, the mounting bracket is further configured to secure the host USB connector port to the PCB by compression. In some embodiments, the USB connector assembly removably attaches to the PCB without the use of any solder joints. In some embodiments, the mounting bracket includes one or more screw holes to allow one or more screws to removably attach the USB connector assembly to the PCB. In some embodiments, the USB connector assembly further includes: a locater component configured to self-register the USB connector assembly on the PCB.

In another illustrative, non-limiting embodiment, a method includes: obtaining a printed circuit board (PCB) including a plurality of electrical contact pads on the surface of the PCB for connection to a Universal Serial Bus (USB) connector, where the electrical contact pads include one or more electrical diagnostic contact pads; obtaining a USB connector including a plurality of spring contacts and one or more diagnostic contacts; and removably attaching the USB connector to the PCB using a fastening component, where the plurality of spring contacts of the USB connector electrically connect to corresponding ones of the plurality of electrical contact pads of the PCB, where the one or more diagnostic contacts electrically connect to the one or more electrical diagnostic contact pads, and where the one or more diagnostic contacts include a conductivity path of a diagnostic circuit when electrically connected to the one or more electrical diagnostic contact pads.

In some embodiments, the USB connector includes a USB compression Type-C connector. In some embodiments, the one or more diagnostic contacts include at least one of: diagnostic surface pads, diagnostic leaf-springs, or outer back row extra diagnostic contacts.

In some embodiments, the method further includes: analyzing a USB connector connectivity detection signal of the diagnostic circuit, where the USB connector connectivity detection signal includes a first value when the USB connector is mated to the PCB, and where the USB connector connectivity detection signal includes a second value when the USB connector is not mated to the PCB; and determining that the USB connector is mated to the PCB based, at least in part, on the analyzing of the USB connector connectivity detection signal.

In some embodiments, the method further includes: analyzing a USB connector connectivity detection signal of the diagnostic circuit; determining that the USB connector is not mated to the PCB based, at least in part, on the analyzing of the USB connector connectivity detection signal; and based, at least in part, on the determination that the USB connector is not mated to the PCB: detaching the fastening component; decoupling the USB connector from the PCB; and replacing the USB connector without replacing the PCB.

In another illustrative, non-limiting embodiment, a printed circuit board (PCB), includes: one or more electrical diagnostic contact pads on the surface of the PCB for connection to one or more diagnostic contacts of a Universal Serial Bus (USB) connector; and the USB connector removably attached to the PCB, where the USB connector includes the one or more diagnostic contacts electrically connected to the one or more electrical diagnostic contact pads, and where the one or more diagnostic contacts include a conductivity path of a diagnostic circuit when the USB connector is mated to the PCB. In some embodiments, the one or more diagnostic contacts include at least one of: diagnostic surface pads, diagnostic leaf-springs, or outer back row extra diagnostic contacts.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1A:
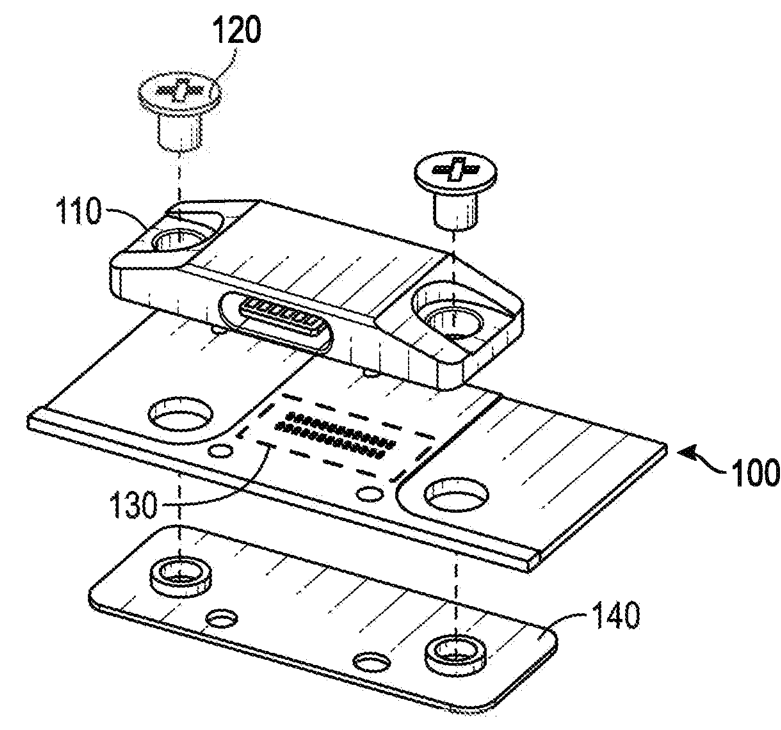
FIG. 1A is a top perspective view of a USB connector assembly including a mounting bracket with a host USB connector port that can be removably attached to a PCB and a support bracket on the opposite side of the PCB from the mounting bracket, according to some embodiments.

Embodiments described herein provide systems and methods to diagnose connectivity of a non-soldered compression Universal Serial Bus (USB) connector. Some embodiments diagnose the health or the condition of a compression type-C USB connector via the use of a diagnostic ground. Some embodiments diagnose the health of the connector in order to determine whether the connector is faulty versus whether the motherboard is faulty. Some embodiments determine whether the USB connector has come off the off the motherboard so that it's no longer fully seated.

In addition, some embodiments provide a USB connector design that allows for easy, cost effective repairability of defective or damaged USB connections in a compact footprint. Some embodiments remove the need for directly soldering the connector to a PCB, and provide a compact, easy to replace component without sacrificing functionality or product feature sets. Some of these embodiments provide a USB Type-C connector. Some embodiments integrate a USB connection into a compact, removable package that promotes repairability with little or no impact to signal integrity, power delivery, or the need for a large system footprint. These embodiments can increase the repairability of IHS products. In addition, embodiments can scale the implementation across various IHS products with a minimal use of space.

USB connectors are mostly soldered directly to PCBs. The few designs that are not directly soldered utilize large, complex and costly "off-PCB" solutions, making both repair or replacement of these connectors complex and costly. Some of these complex and costly solutions could be: (1) fully replacing the PCB, such as fully replacing the motherboard (MB); (2) implementing expensive flexible printed circuits (FPCs) or micro-coax cables with additional connectors; (3) implementing expensive additional I/O PCBs that are connected with additional board-to-board (BTB) connectors; or (4) including a "framework" USB type-C extension board with additional B2B connectors. Therefore, these complex and costly solutions either have a high cost of repair, a high difficulty of repair, or both a high cost and a high difficulty.

With USB Type-C being broadly used for both high-speed data and power delivery in notebooks, there is a need for these connectors to be easy to repair, and without a high cost. In addition, parts of the IHS industry have increased focus on consumer product repairability. For example, the French Repairability Index (FRI) specifically imposes a large penalty on power connector repairability due to its heavy use. More specifically, Article L. 541-9-2 of the French Environmental Code states that manufacturers, importers, marketers and other retailers which put electrical and electronic equipment (EEE) on the French market have to inform, free of charge, downstream sellers and any person who made the request of "the reparability index" of their products, as well as the parameters explaining how such index was established. This reparability index will inform consumers about the ability to repair the product category concerned. Applicable categories of the repairability index include: documentation, disassembly, availability of spare parts, price of spare parts, and product specific categories (i.e. types of updates available by product). The FRI is likely to be a benchmark for other countries to adopt going forward.

Fully integrated PCBs pose a large challenge for Input/Output (I/O) connector repair, and especially USB connector repair. In addition, product designs are transitioning to USB Type-C for power delivery and many regulators will soon be imposing the use of USB Type-C connectors for power as a common customer experience. This will have a large impact on repairability with designs directly soldered to PC boards. For example, notebook Type-C USB and power connectors experience high cycle counts due to their portability, making them more susceptible to damage over time. The high-speed/high-power requirements of Type-C connectors have historically required larger, more complex and more expensive solutions to decouple the connectors from PCBAs.

Therefore, some embodiments of the present disclosure provide a solution to one or more of these problems by at least: 1) addressing the repairability challenges associated with the use of integrated/soldered USB connectors (e.g., USB Type-C connectors); and/or 2) providing full USB functionality (e.g., full USB Type-C functionality) in a small, cost-effective package. Some embodiments provide for a USB connector that allows for case of assembly and disassembly while maintaining the structural and signal integrity of a soldered connection. If a USB connector fails with these embodiments, the USB connector can be easily replaced by a client, customer, or end-user with minimal tools and effort.

Some embodiments provide a compression connector design. A compression design can support a higher pin count (e.g., such as is required by USB Type-C connectors), while ensuring proper contact to support much higher data transfer speeds and power delivery requirements. These embodiments can provide these advantages without the need for surface-mount technology (SMT).

In addition, some embodiments can provide an integrated structural design that maintains a required pin contact force for signal integrity, while supporting a high cycle count to allow for the frequent use of power connectors (e.g., such as is required of Type-C connectors). In addition, some embodiments can also solve space, complexity and cost issues of existing FPC, I/O Board, or adapter designs, while maintaining USB functionality (e.g., USB Type-C functionality) in a single, compact connector assembly.

As discussed above, some embodiments of the present disclosure operate as USB Type-C connectors, in particular. USB-C (properly known as USB Type-C) is a 24-pin USB connector system with a rotationally symmetrical connector. The designation C refers only to the connector's physical configuration or form factor and should not be confused with the connector's specific capabilities, which are designated by its transfer specifications (such as USB 3.2 or USB4). A notable feature of the USB-C connector is its rotational symmetry-a plug may be inserted into a receptacle in either orientation.

In addition, some embodiments of the present disclosure can support at least USB Power Delivery (USB PD) Specification Revision 3.1. Announced in 2021, the USB PD Revision 3.1 specification is a major update to enable delivering up to 240 W of power over full featured USB Type-C cables and connectors. Prior to this update, USB PD was limited to 100 W using a solution based on 20V, using USB Type-C cables rated at 5 A. With revision 3.01, power levels are increased from existing USB standards up to 240 W. Revision 3.1 allows for 28V, 36V, and 48V fixed voltages to enable up to 140 W, 180 W and 240 W power levels, respectively. An adjustable voltage supply mode allows the device being powered an ability to request intermediate voltages between 15V and up to the maximum available fixed voltage of the charger.

The USB Type-C specification has also been updated to Release 2.1 to define 240 W cable requirements, and with the updated USB PD protocol and power supply definition, this extends the applicability of USB power delivery to a large number of applications where 100 W wasn't adequate. Embodiments of the present disclosure support at least USB PD Revision 3.1 and USB Type-C specification Release 2.1. Therefore, some embodiments of the present disclosure are configured to conduct at least 240 Watts (W) of power when electrically connected to electrical contact pads of a PCB.

In addition, some embodiments of the present disclosure can also support at least USB4 version 2.0. USB4, sometimes referred to as USB 4.0, is a technical specification that the USB Implementers Forum (USB-IF) first released on 29 Aug. 2019. The USB4 architecture can share a single, high-speed link with multiple hardware endpoints dynamically, best serving each transfer by data type and application. In contrast to prior USB protocol standards, USB4 mandates the exclusive use of the Type-C connector and USB Power Delivery (USB-PD) specification. USB4 products must support 20 Gbit/s throughput. However, the USB4 2.0 specification was released on Oct. 18, 2022, by the USB Implementers Forum, delivering 80 Gbits/s and even 120 Gbit/s in asymmetric mode. For example, USB4 Gen 4×1 has a single lane that can operate at 40 Gbits per second nominal speed. USB4 Gen 4×2 has dual lanes that can operate at 80 Gbits per second nominal speed. USB4 Gen 4 Asymmetric has triple lanes that can operate at 120 Gbits per second nominal speed. Therefore, some embodiments of the present disclosure are configured to communicate at least greater than 40 Gigabits per second of data transfer when electrically connected to the corresponding ones of the electrical contact pads of the PCB.

Therefore, at least some embodiments of the present disclosure provide a USB connector (e.g., a USB Type-C connector) that allows for easy, cost effective repairability of defective or damaged connections in a compact footprint. These embodiments can avoid a need for a full replacement of a PCB (e.g., a motherboard), or a system, by clients, customers, or end-users. These embodiments can eliminate an industry-wide failure mode of damaged connector solder joints related to external forces or cycle counts. These embodiments can increase the repairability of the product by the client, customer, or end-user, while maintaining connector strength and signal integrity requirements for high-speed data transfer and high-current power requirements. Some of these embodiments do not use solder joints, such that a damaged connector can be easy to remove with standard tools. Some embodiments limit connector strain exposure, and ensure proper contact force with an integrated mechanical mounting support. Some embodiments provide a USB connector that is completely decoupled from a PCB (e.g., a motherboard) while maintaining full USB (e.g., full USB Type-C) functionality. These embodiments support a client's, customer's, or end-user's right to product repairability by providing an innovation in repairable product design. Some of these embodiments align with Repairability & Durability requirements and/or legislation currently in place, and/or those expected to be adopted by additional countries soon.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

FIG. 1A depicts a top perspective view of a USB connector assembly including a mounting bracket 110, with a host USB connector port secured within the mounting bracket, that can be removably attached to a PCB 100, according to some embodiments. FIG. 1A also depicts a support bracket 140 on the opposite side of the PCB 100 from the mounting bracket 110. One or more fastening components, such as the two screws 120 depicted in FIG. 1A can removably attach the USB connector assembly, which can include the mounting bracket 110 and possibly the support bracket 140, to the PCB 100. A plurality of electrical contact pads 130 on the surface of the PCB 100 can provide a connection to the USB connector assembly.

Figure 1B:
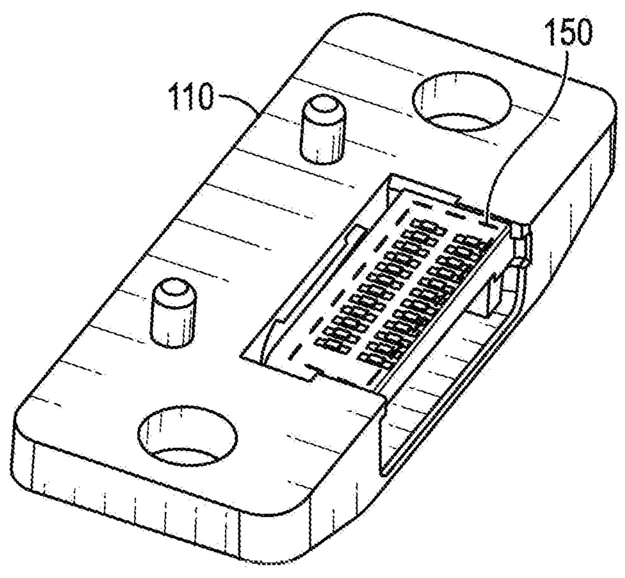
FIG. 1B is a bottom perspective view of a USB connector assembly showing the spring contacts, according to some embodiments.

In the embodiment of FIG. 1A, the mounting bracket 110 includes a plurality of spring contacts 150 on its underside (as depicted FIG. 1B). As the USB connector, including the mounting bracket 110, is removably attached to the PCB using the fastening component, the plurality of spring contacts electrically connect to corresponding ones of the plurality of electrical contact pads 130 of the PCB 100. In addition, one or more individual spring contacts of the plurality of spring contacts apply a contact force to corresponding ones of the electrical contact pads of the PCB. The fastening component can be a screw, for example. Removably attaching the USB connector to the PCB using the fastening component might include tightening the screw to compress the USB connector against the PCB, in some embodiments.

FIG. 1B is a bottom perspective view of a USB connector assembly, including the mounting bracket 110. As depicted in FIG. 1B, and according to some embodiments, a host USB connector port is mechanically secured within the mounting bracket. In particular, FIG. 1B depicts the spring contacts 150 on the underside of the mounting bracket 110, according to some embodiments. In some embodiments, the spring contacts 150 are configured to electrically connect to corresponding ones of a plurality of electrical contact pads 130 of the PCB 100, where an individual spring contact of the plurality of spring contacts applies a contact force to a corresponding one of the electrical contact pads of the PCB upon assembly of the mounting bracket onto the PCB.

Therefore, the embodiment of FIG. 1 removes the need for directly soldering the USB connector assembly to a PCB. The embodiment of FIG. 1 provides a compact, easy to replace component, without sacrificing functionality or product feature sets. The embodiment of FIG. 1 does not use solder joints, such that a damaged USB connector assembly can be easy to remove with standard tools.

Figure 2:
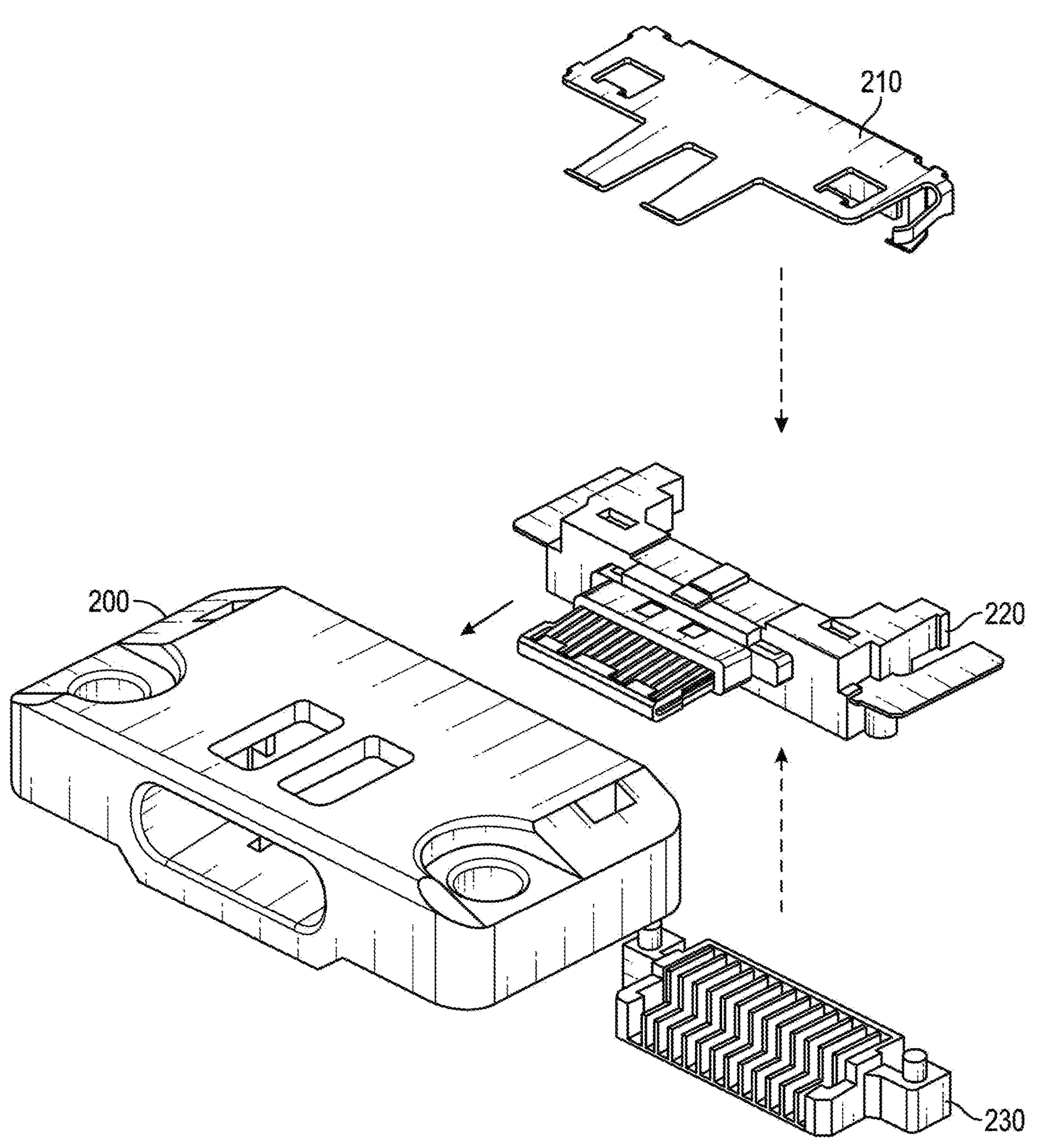
FIG. 2 is a top perspective view of a USB connector assembly showing different components that can comprise the assembly, according to some embodiments.

FIG. 2 is a top perspective view of a USB connector assembly, further depicting different components that can comprise the assembly, according to some embodiments. In particular, FIG. 2 depicts a mounting bracket 200, and a host USB connector port 220 that includes a plurality of spring contacts. The spring contacts are located on the underside of the host USB connector port 220, and are therefore not shown in FIG. 2, but are instead depicted by the host USB connector port 320 of FIG. 3.

FIG. 2 further depicts a top component 210 that can act as a ground spring. The top of ground spring 210 slides underneath the top of the mounting bracket 200, such that its two teeth then latch into the 2 holes on the top of the mounting bracket. When inserted into the structure of the mounting bracket 200, the ground spring 210 can put a downward force onto the USB connector port 220, such that the spring contacts located on the underside of the host USB connector port 220 then put a downward force onto the electrical contact pads 130 of the PCB 100. FIG. 2 further depicts a locater component 230 that connects to the underside of the mounting bracket 200 and host USB connector port 220. The locater component 230 can be configured to self-register the USB connector assembly on the PCB.

The mounting bracket 200 can be a die cast shell structure, in some embodiments. The die cast shell structure can enable standalone mechanical strength and a safe surface for a repair or replacement process.

Figure 3:
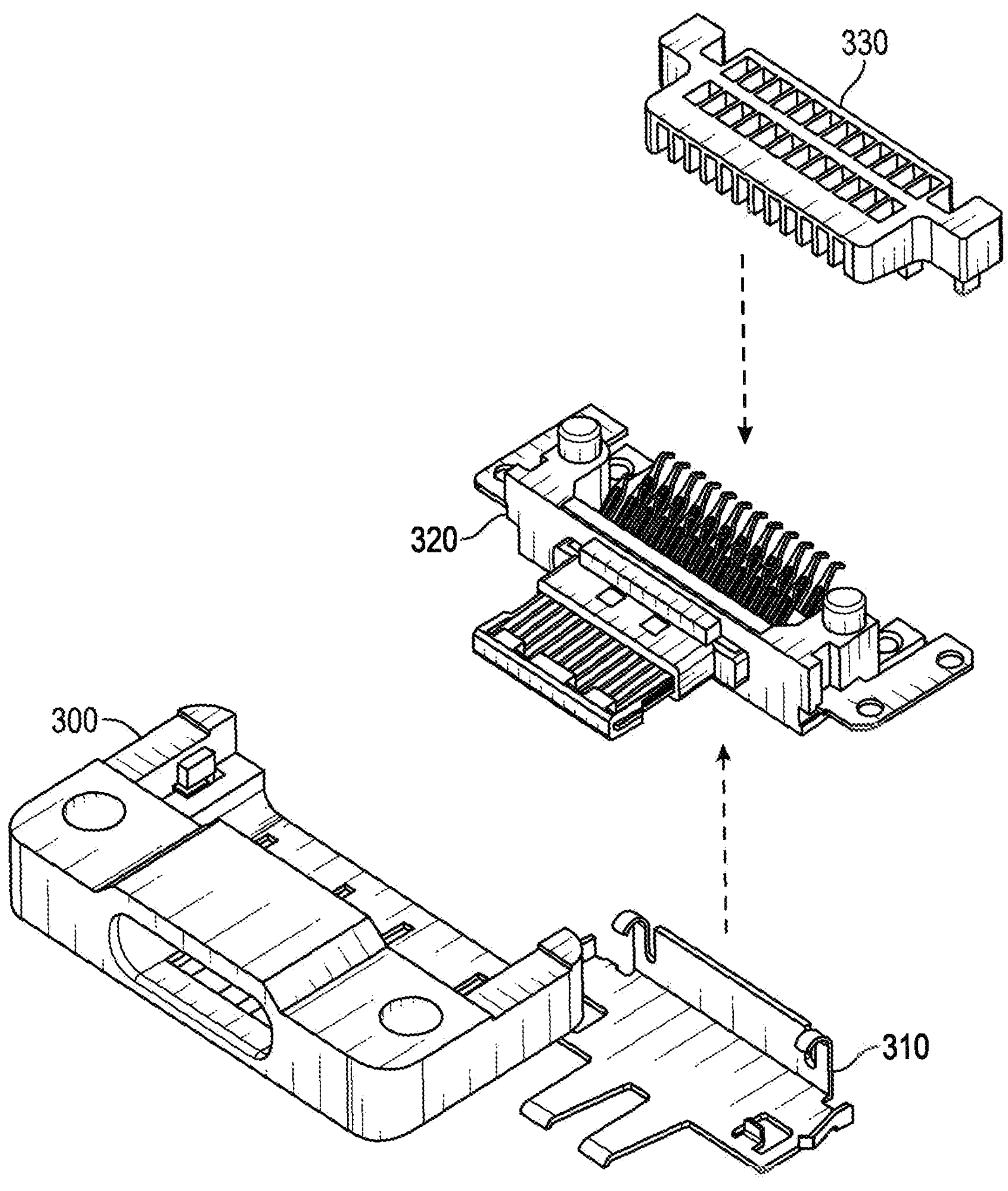
FIG. 3 is a bottom perspective view of the USB connector assembly of FIG. 2, showing the same components that comprise the assembly of FIG. 2 from the opposite side, according to some embodiments.

FIG. 3 is a bottom perspective view of the USB connector assembly of FIG. 2, showing the same components that comprise the assembly of FIG. 2 from the opposite side, according to some embodiments. In particular, FIG. 3 depicts the mounting bracket 300 from the underside perspective, and the host USB connector port 320 that includes the plurality of spring contacts. The spring contacts are located on the underside of the host USB connector port 320. FIG. 3 depicts two rows of spring contacts, where each row has 12 spring contacts for a total of 24 spring contacts in the host USB connector port 320 component. FIG. 3 further depicts the top component 310 that can act as a ground spring.

FIG. 3 further depicts a locater component 330 that connects to the underside of the mounting bracket 300 and host USB connector port 320. The locater component 330 has two roles of holes for the ground springs of the host USB connector port 320 to be inserted through. In particular, the locater component 330 has 24 total holes for the 24 total spring contacts, divided up into two rows of 12 holes each, such that they match the positions of the spring contacts when the locater component 330 and host USB connector port 320 component are assembled together.

FIGS. 4A-4E depict various perspective views of a USB connector assembly 410 being removably attached to a PCB 400 using two screws (420, 422), according to some embodiments. FIGS. 4A-4E in essence depicts a simple assembly and disassembly process for the USB connector assembly 410. FIGS. 4A-4E depicts a straightforward process where the USB connector assembly 410 self-registers and then is secured by screws (420, 422). FIGS. 4A-4E depict a flush PCB placement design that enables replacement capability.

Figures 4A, 4B:
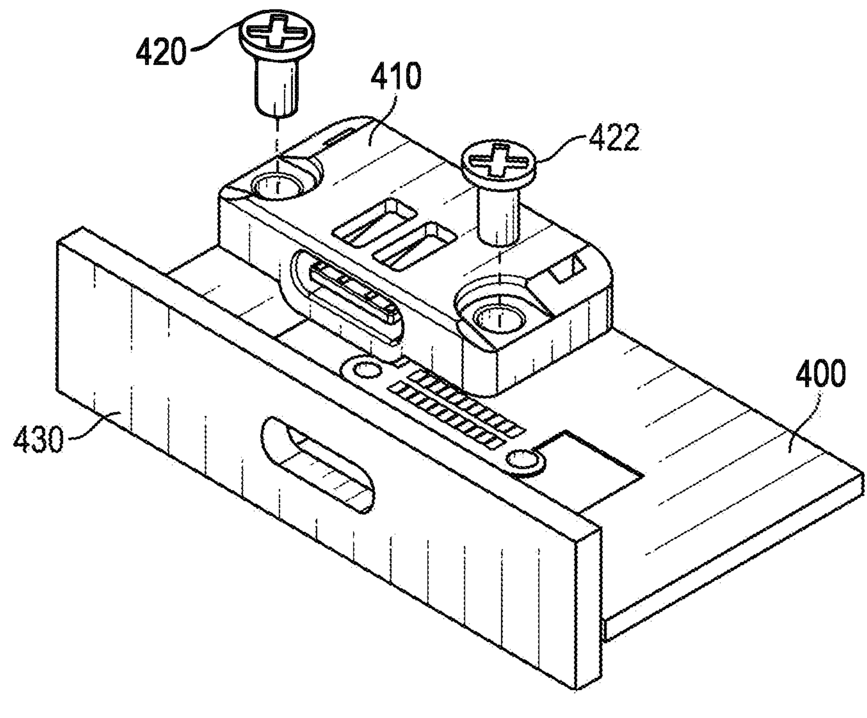
FIGS. 4A-4E are various perspective views of a USB connector assembly being removably attached to a PCB using two screws, according to some embodiments.

In particular, FIG. 4A depicts the placement of the USB connector assembly 410 upon a PCB 400, in a position so that its host USB connector port lines up with the slot in the PC C-cover 430, so that a peripheral USB connection plug can be inserted through the slot of the PC C-cover 430 and into the host USB connector port of the USB connector assembly 410. The USB connector assembly 410 includes a mounting bracket housing, such that the majority of what is drawn of the USB connector assembly 410 in FIG. 4A is the mounting bracket. However, in the embodiment of FIG. 4A, the mounting bracket, as well as the internals of the mounting bracket, which include at least a plurality of spring contacts, comprise the USB connector assembly 410 as a whole. The USB connector assembly 410 is secured to the PCB 400 using fastening components, which in the embodiment of FIG. 4A are two screws (420, 422).

Figure 4C:
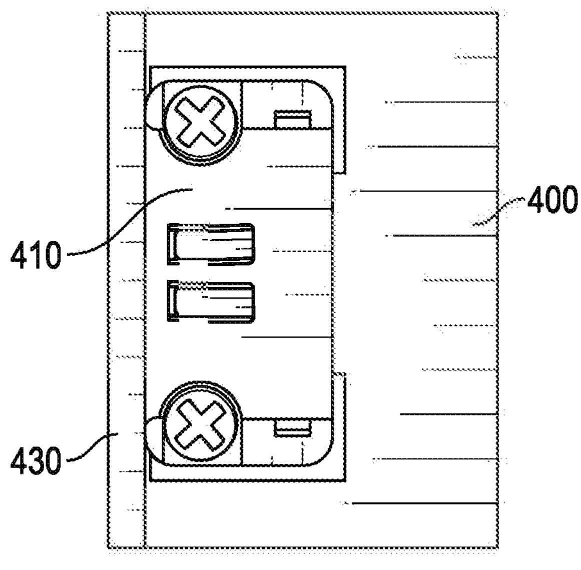
Figure 4D:
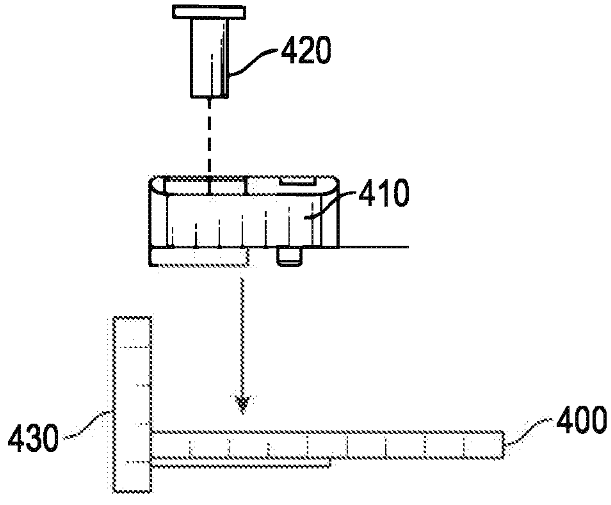
Figure 4E:
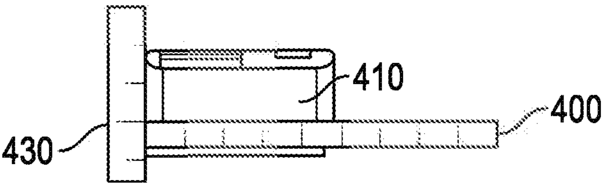

FIG. 4B is a diagonal perspective view depicting the USB connector assembly 410 secured to the PCB 400 using fastening components, such that its host USB connector port lines up with the slot in the PC C-cover 430. FIG. 4C is a top perspective view depicting the USB connector assembly 410 secured to the PCB 400 using fastening components, such that its front is flush with the PC C-cover 430. FIG. 4D is a side perspective view depicting the placement of the USB connector assembly 410 upon the PCB 400, and being secured by a fastening component 420, in a position so that its front is flush with the PC C-cover 430. FIG. 4E is a side perspective view depicting the USB connector assembly 410 secured to the PCB 400, such that its front is flush with the PC C-cover 430.

Figure 5:
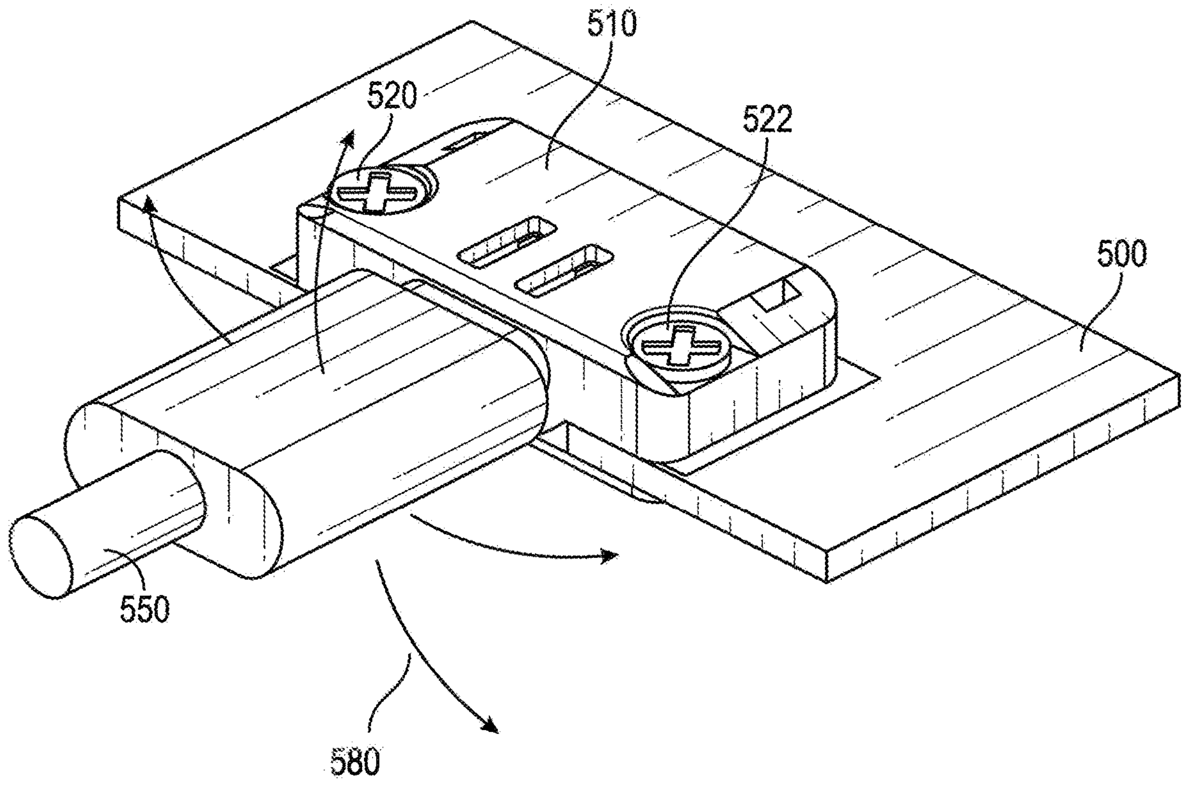
FIG. 5 depicts a perspective view of the USB connector assembly being a robust structure to handle wrenching stress, according to some embodiments.

FIG. 5 depicts a perspective view of the USB connector assembly being a robust structure to handle wrenching stress, according to some embodiments. FIG. 5 is a diagonal perspective view depicting the USB connector assembly 510 secured to the PCB 500 using fastening components (520, 522), which in the embodiment of FIG. 5 is two screws. FIG. 5 also depicts that various kinds of wrenching stress 580 might be applied by the client, customer, or end-user to the peripheral USB connector plug 550. However, the design of the USB connector assembly 510 provides superior mechanical strength when compared to previous USB connectors. The USB connector assembly 510 provides a robust structure to handle wrenching stress.

Figure 6A:
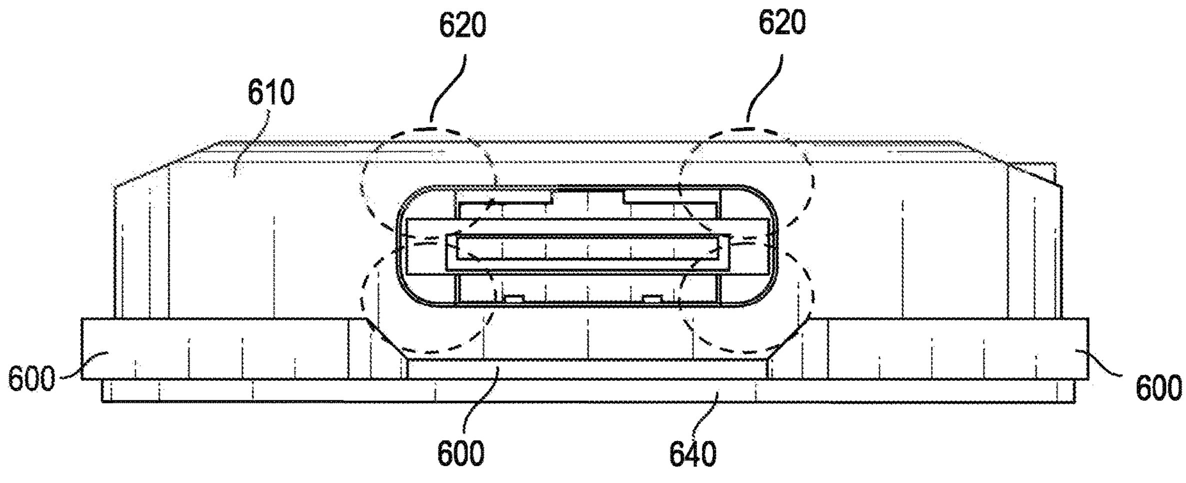
FIG. 6A depicts a side perspective view of the USB connector assembly removably attached to a PCB, where the host USB connector port includes stopper surfaces within the host USB connector port, in the insertion direction of a peripheral USB connector plug, according to some embodiments.

FIG. 6A depicts a side perspective view of the USB connector assembly 610 (and in some embodiments 640 as well) removably attached to a PCB 600, where the host USB connector port of the USB connector assembly 610 includes four stopper surfaces 620 (depicted within the four dashed circles) within the host USB connector port, in the insertion direction of a peripheral USB connector plug, according to some embodiments. FIG. 6A also depicts a support bracket 640 that is removably attached to the opposite side of the PCB 600 than the mounting bracket (external housing of item 610) by the same one or more fastening components that removably attach the mounting bracket (external housing of item 610) to the PCB. In the embodiment of FIG. 6A, the mounting bracket is simply the external housing of the component labelled 610, while the USB connector assembly 610 includes the mounting bracket, as well components mechanically secured to the mounting bracket, including the components internal to the mounting bracket. In the embodiment of FIG. 6A, this would include at least a plurality of spring contacts. In some embodiments, the USB connector assembly 610 might include the support bracket 640 as well, when a support bracket is used. In other embodiments, the USB connector assembly 610 might not include a support bracket 640, even if a support bracket is used, and might only include the mounting bracket and the components mechanically secured to the mounting bracket. In other words, whether a support bracket 640 is considered to be part of the USB connector assembly 610 as a whole is determined by the embodiment.

Figure 6B:
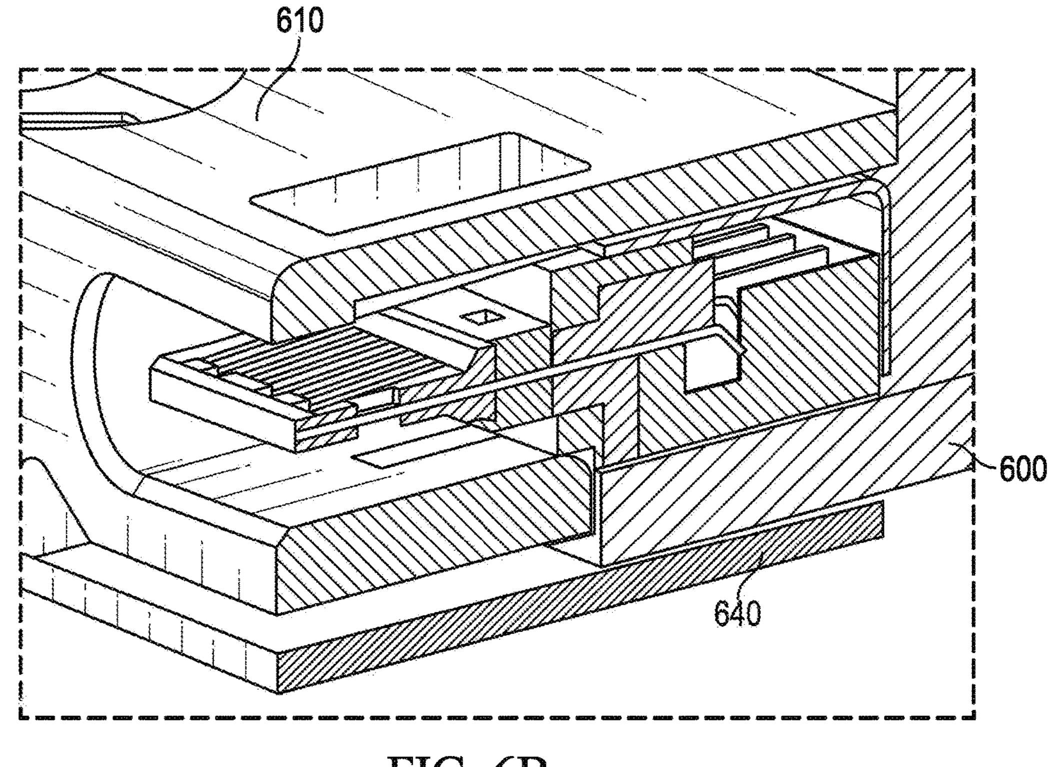
FIG. 6B depicts a diagonal perspective view of the USB connector assembly removably attached to a PCB, where the mounting bracket includes stopper surfaces in the insertion direction of a peripheral USB connector plug configured to contact against the PCB and provide a counter insertion force from the PCB to the mounting bracket, according to some embodiments.

FIG. 6B depicts a diagonal perspective view of the USB connector assembly 610 removably attached to a PCB 600, where the mounting bracket (external housing of item 610) includes stopper surfaces in the insertion direction of a peripheral USB connector plug configured to contact against the PCB and provide a counter insertion force from the PCB to the mounting bracket, according to some embodiments. FIG. 6B also depicts a support bracket 640 that is removably attached to the opposite side of the PCB 600 than the mounting bracket (external housing of item 610) by the same one or more fastening components that removably attach the mounting bracket to the PCB 600.

Figure 6C:
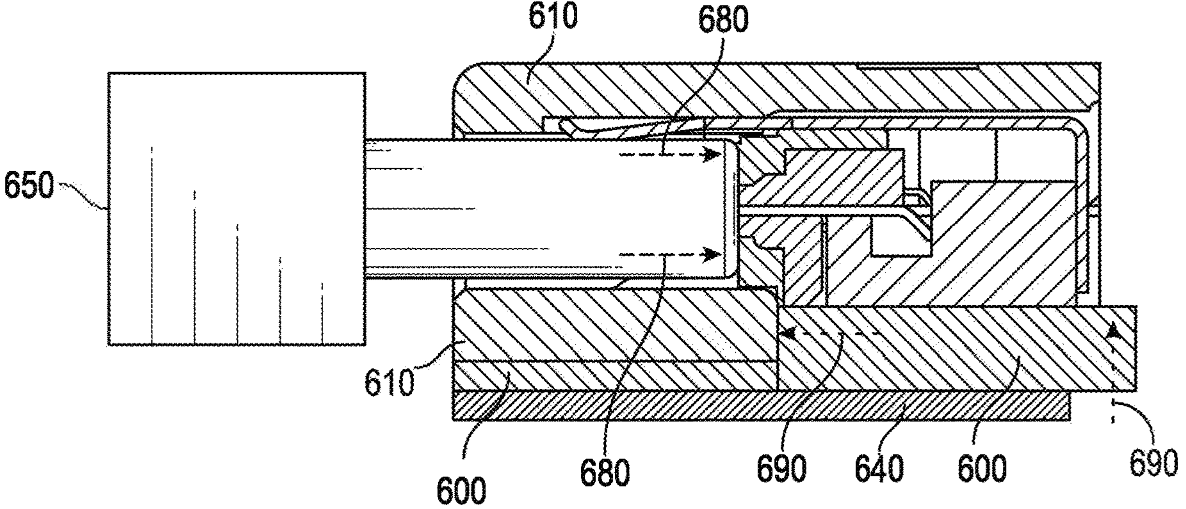
FIG. 6C depicts a side cutout perspective view of the USB connector assembly removably attached to a PCB, where a peripheral USB connector plug is inserted into the host USB connector port, and where the insertion force from the plug is countered by a counter insertion force from the PCB, according to some embodiments.

FIG. 6C depicts a side cutout perspective view of the USB connector assembly 610 removably attached to a PCB 600, where a peripheral USB connector plug 650 is inserted into the host USB connector port, according to some embodiments. FIG. 6C also depicts a support bracket 640 that is removably attached to the opposite side of the PCB 600 than the mounting bracket (external housing of item 610). In FIG. 6C, the insertion force 680 (represented by the dashed arrows) from the USB connector plug 650 is countered by a counter insertion force 690 (represented by the dashed arrows) from the PCB 600 to the USB connector assembly 610, and in particular from the PCB 600 to the mounting bracket of the USB connector assembly 610.

Figure 7A:
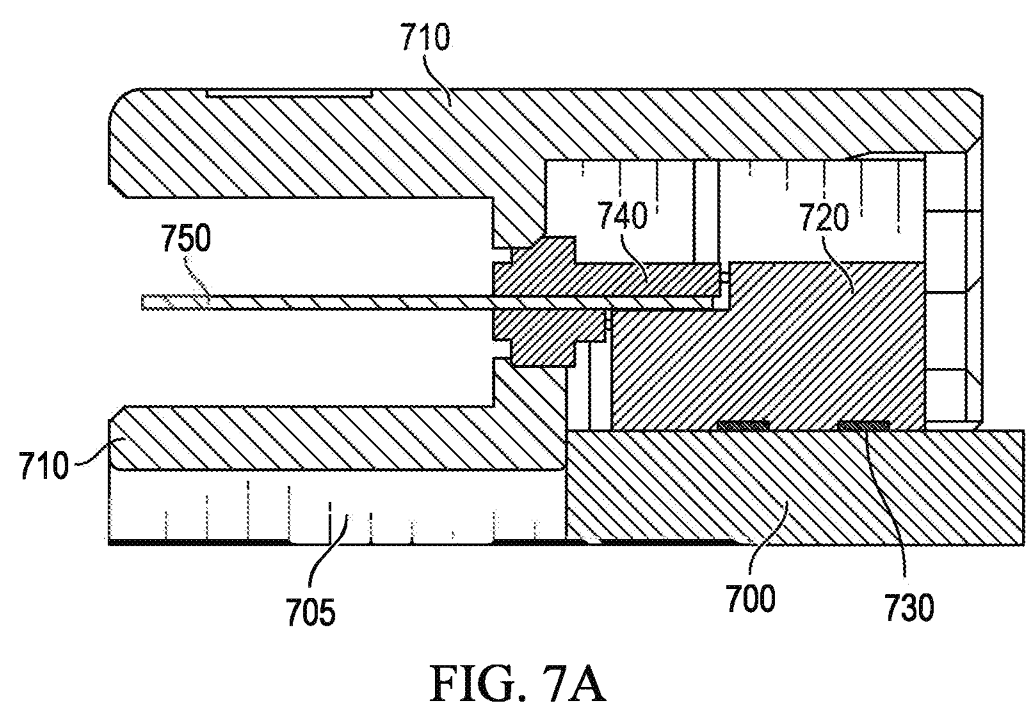
FIGS. 7A and 7B depict other side cutout perspective views of the USB connector assembly removably attached to a PCB with electrical contact pads, according to some embodiments.

FIG. 7A depicts another side cutout perspective view of the USB connector assembly (710, 750, 740, 720) removably attached to a PCB (700, 705) with two electrical contact pads 730, according to some embodiments. The USB connector assembly includes a mounting bracket 710, as depicted in FIG. 7A. The tongue 750 of the host USB connector port of the USB connector assembly is secured in place by securing component 740. The electrical contacts from the tongue 750 are provided to the component 720 that houses the plurality of spring contacts (where the plurality of spring contacts are not shown in FIG. 7A). The plurality of spring contacts are disposed at least in part within the mounting bracket 710, where the spring contacts are configured to electrically connect to corresponding ones of the plurality of electrical contact pads 730 of the PCB (700, 705). In addition, an individual spring contact of the plurality of spring contacts applies a contact force to a corresponding one of the electrical contact pads 730 of the PCB (700, 705) upon assembly of the mounting bracket 710 onto the PCB (700, 705).

Figure 7B:
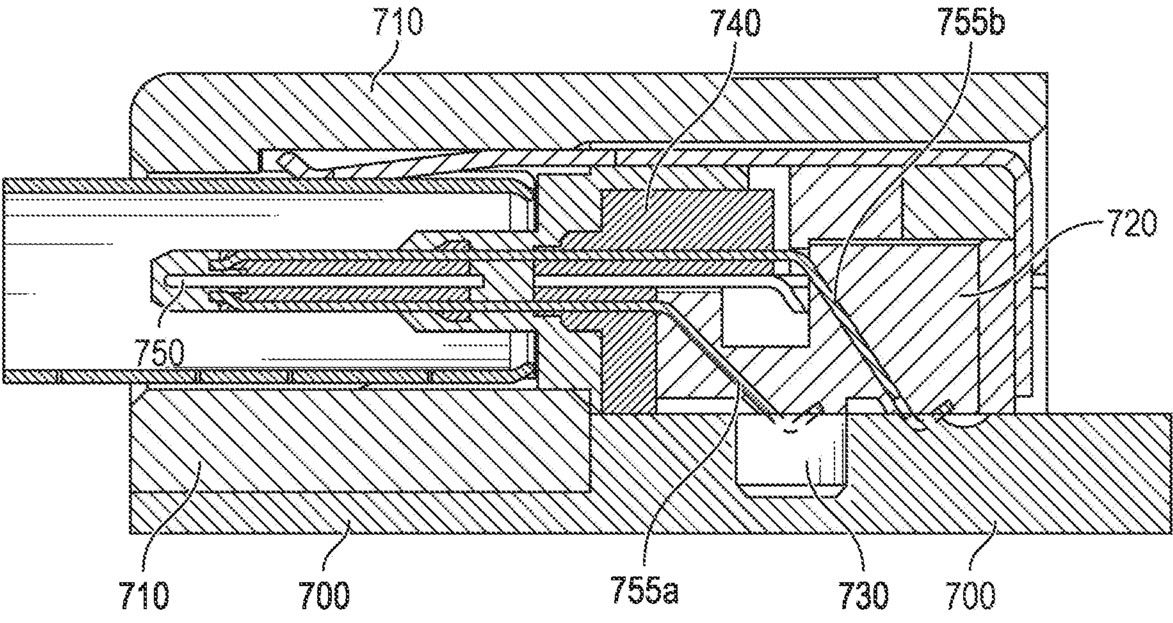

FIG. 7B depicts another side cutout perspective view of the USB connector assembly (710, 750, 755*a*, 755*b*, 740, 720) removably attached to a PCB (700). However, FIG. 7B also depicts the spring contacts (755*a*, 755*b*) interacting with the contact pads (730). In FIG. 7B the contact pad 730 for spring contact 755*a* is shown, but the contact pad for spring contact 755*b* is not shown. As with FIG. 7A, the USB connector assembly includes a mounting bracket 710, as depicted in FIG. 7B. The tongue 750 of the host USB connector port of the USB connector assembly is secured in place by securing component 740. The spring contacts (755*a*, 755*b*) from the tongue 750 are provided to the component 720, and then routed to the contact pads 730. Although FIG. 7B only depicts two spring contacts, FIG. 7B is only depicting one "slice" of the USB connector assembly with one pair (755*a*, 755*b*) of spring contacts depicted. There can be many other pairs of spring contacts arranged along the length of the tongue 750 that are also routed to their own contact pads. In one embodiment, there are 12 pairs of spring contacts, for a total of 24 spring contacts, as depicted in FIG. 3. The plurality of spring contacts (755*a*, 755*b*) are disposed at least in part within the mounting bracket 710, where the spring contacts (755*a*, 755*b*) are configured to electrically connect to corresponding ones of the plurality of electrical contact pads 730 of the PCB 700. In addition, an individual spring contact 755*a* of the plurality of spring contacts applies a contact force to a corresponding one of the electrical contact pads 730 of the PCB 700 upon assembly of the mounting bracket 710 onto the PCB 700.

Figure 8:
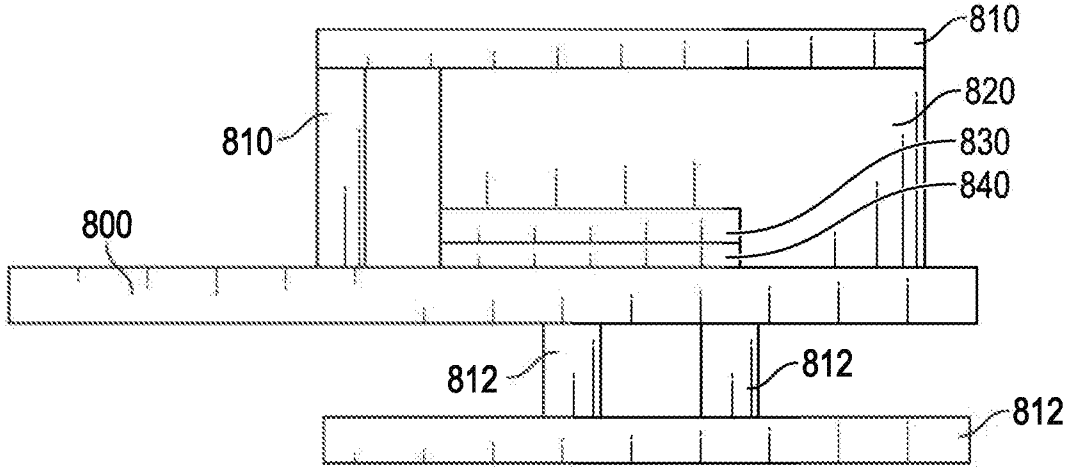
FIG. 8 depicts a side perspective view of the USB connector assembly removably attached to a PCB, where an interposer connector includes the plurality of spring contacts to electrically connect the host USB connector port to the PCB, according to some embodiments.

FIG. 8 depicts a side perspective view of the USB connector assembly (810, 820, 830, 840) removably attached to a PCB 800, according to some embodiments. The USB connector assembly of FIG. 8 includes a structural mounting bracket 810, a standard USB connector 820, an interposer PCB 830, and an interposer connector 840. An interposer is a compression-mounted interconnect device that is positioned between boards and/or sockets to allow an electrical signal to pass through. FIG. 8 also depicts a support bracket 812 that is removably attached to the opposite side of the PCB 800 than the mounting bracket 810. The interposer connector 840 includes the plurality of spring contacts to electrically connect the host USB connector port 820 to the PCB 800, according to some embodiments. Therefore, the plurality of spring contacts of the interposer connector 840 are disposed at least in part within the mounting bracket 810, as shown in FIG. 8.

This embodiment of FIG. 8 allows for the use of a standard soldered USB connector, in some embodiments, while maintaining a similar footprint and performance to the embodiment of FIG. 1, for example. Therefore, the standard USB connector 820 of FIG. 8 might be a standard soldered USB connector 820, in some embodiments. Such a standard soldered USB connector 820 can be soldered to an interposer PCB 830, in some embodiments. The interposer PCB can provide a mapping from the soldered connections of the standard soldered connector 820 to the footprint required by the electrical contact pads of the PCB 800, in some embodiments. The interposer connector 840 can house a plurality of spring contacts, in some embodiments. The interposer connector 840 might be low-profile, in some embodiments. The spring contacts of the interposer connector 840 can electrically connect to corresponding ones of a plurality of electrical contact pads of the PCB 800, where an individual spring contact of the plurality of spring contacts applies a contact force to a corresponding one of the electrical contact pads of the PCB 800 upon assembly of the mounting bracket 810 onto the PCB 800. In the embodiment of FIG. 8, no solder joints are required for mounting USB connector assembly (810, 820, 830, 840) to the PCB board 800. However, there might be solder joints in the connection between a standard USB connector 820 and the interposer PCB 830 of the USB connector assembly, in some embodiments.

Figure 9:
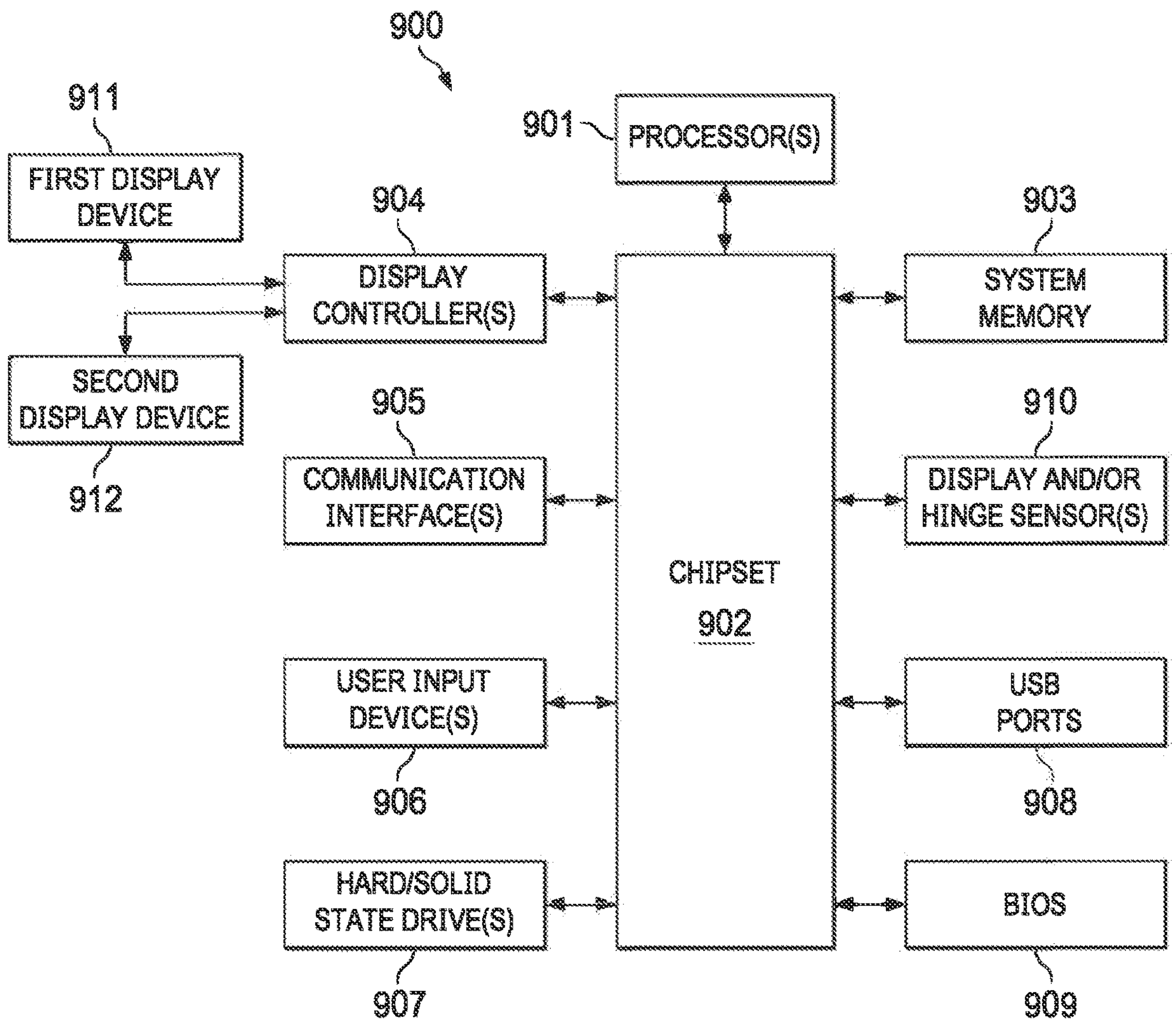
FIG. 9 is a diagram illustrating an example of environment 900 where systems and methods described herein may be implemented, according to some embodiments.

FIG. 9 is a diagram illustrating an example of environment 900 where systems and methods described herein may be implemented, according to some embodiments. As depicted, components 900 include one or more processors 901. In various embodiments, IHS 900 may be a single-processor system, or a multi-processor system including two or more processors. Processor 901 may include any processor capable of executing program instructions, such as a PENTIUM series processor, or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 900 includes chipset 902 coupled to processor 901. In certain embodiments, chipset 902 may utilize a QuickPath Interconnect (QPI) bus to communicate with processor 901. In various embodiments, chipset 902 may provide processor 901 with access to a number of resources. Moreover, chipset 902 may be coupled to communication interface(s) 905 to enable communications via various wired and/or wireless networks, such as Ethernet, WiFi, BLUETOOTH, cellular or mobile networks (e.g., CDMA, TDMA, LTE, etc.), satellite networks, or the like. Communication interface(s) 905 may also be used to communicate with certain peripherals devices (e.g., BT speakers, microphones, headsets, etc.). Moreover, communication interface(s) 905 may be coupled to chipset 902 via a Peripheral Component Interconnect Express (PCIe) bus, or the like.

Chipset 902 may be coupled to display controller(s) 904, which may include one or more or graphics processor(s) (GPUs) on a graphics bus, such as an Accelerated Graphics Port (AGP) or Peripheral Component Interconnect Express (PCIe) bus. As shown, display controller(s) 904 provides video or display signals to one or more display devices, such as a first display device 911 and second display device 902. In other implementations, any number of display controller(s) 904 and/or display devices 911/912 may be used.

Each of display devices 911 and 912 may include a flexible display that is deformable (e.g., bent, folded, rolled, or stretched) by an external force applied thereto. For example, display devices 911 and 912 may include Liquid Crystal Display (LCD), Light Emitting Diode (LED), organic LED (OLED), AMOLED, plasma, electrophoretic, or electrowetting panel(s) or film(s). Each display device 911 and 912 may include a plurality of pixels arranged in a matrix, configured to display visual information, such as text, two-dimensional images, video, three-dimensional images, etc.

Display device(s) 911/912 may be configured to sense haptic and/or physical touch events, and to generate touch information. To this end, display device(s) 911/912 may include a touchscreen matrix (e.g., a layered capacitive panel or the like) and/or touch controller configured to receive and interpret multi-touch gestures from a user touching the screen with a stylus or one or more fingers. In some cases, display and touch control aspects of display device(s) 911/912 may be collectively operated and controlled by display controller(s) 904.

In some cases, display device(s) 911/912 may also include a deformation or bending sensor configured to generate deformation or bending information including, but not limited to: the bending position of a display (e.g., in the form of a "bending line" connecting two or more positions at which bending is detected on the display), bending direction, bending angle, bending speed, etc. In these implementations, display device(s) 911/912 may be provided as a single continuous display, rather than two discrete displays.

Chipset 902 may also provide processor 901 and/or display controller(s) 904 with access to memory 903. In various embodiments, system memory 903 may be implemented using any suitable memory technology, such as static RAM (SRAM), dynamic RAM (DRAM) or magnetic disks, or any nonvolatile/Flash-type memory, such as a solid-state drive (SSD) or the like. Memory 903 may store program instructions that, upon execution by processor 901 and/or controller(s) 904, present a UI interface to a user of IHS 900.

Chipset 902 may further provide access to one or more hard disk and/or solid-state drives, optical drives, or other removable-media drives 907. In certain embodiments, chipset 902 may also provide access to one or more optical drives or other removable-media drives. In certain embodiments, chipset 902 may also provide access to one or more Universal Serial Bus (USB) ports 908, to which one or more peripheral devices may be coupled (e.g., integrated or external webcams, microphones, speakers, etc.). The USB ports 908 may use one or more embodiments of the USB connector assemblies described in the present disclosure.

Upon booting of IHS 900, processor(s) 901 may utilize Basic Input/Output System (BIOS) 909 instructions to initialize and test hardware components coupled to IHS 900 and to load an Operating System (OS) for use by IHS 900. BIOS 909 provides an abstraction layer that allows the OS to interface with certain hardware components that are utilized by IHS 900. Via the hardware abstraction layer provided by BIOS 909, software stored in memory 903 and executed by the processor(s) 901 of IHS 900 is able to interface with certain I/O devices that are coupled to the IHS 900. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

Chipset 902 may also provide access to one or more user input devices 906, for example, using a super I/O controller or the like. For instance, chipset 902 may provide access to a keyboard (e.g., keyboard 103), mouse, trackpad, stylus, totem, or any other peripheral input device, including touchscreen displays 911 and 912. These input devices may interface with chipset 902 through wired connections (e.g., in the case of touch inputs received via display controller(s) 904) or wireless connections (e.g., via communication interfaces(s) 905). In some cases, chipset 902 may be used to interface with user input devices such as keypads, biometric scanning devices, and voice or optical recognition devices.

Each of user input devices 906 may include a respective controller (e.g., a touchpad may have its own touchpad controller) that interfaces with chipset 902 through a wired or wireless connection (e.g., via communication interfaces(s) 905). In some cases, chipset 902 may also provide access to one or more user output devices (e.g., video projectors, paper printers, 3D printers, loudspeakers, audio headsets, Virtual/Augmented Reality (VR/AR) devices, etc.)

In certain embodiments, chipset 902 may also provide an interface for communications with one or more hardware sensors 910. Sensors 910 may be disposed within displays 911/912 and/or display controllers 904, and may include, but are not limited to: electric, magnetic, radio, optical, infrared, thermal, force, pressure, acoustic, ultrasonic, proximity, position, deformation, bending, direction, movement, velocity, rotation, and/or acceleration sensor(s).

An embedded Controller (EC) or Baseboard Management Controller (BMC) can be operational from the very start of each IHS power reset and handles various tasks not ordinarily handled by host processor(s) 201. Examples of these operations may include, but are not limited to: receiving and processing signals from a keyboard or touchpad, as well as other buttons and switches (e.g., power button, laptop lid switch, etc.), receiving and processing thermal measurements (e.g., performing fan control, CPU and GPU throttling, and emergency shutdown), controlling indicator LEDs (e.g., caps lock, scroll lock, num lock, battery, ac, power, wireless LAN, sleep, etc.), managing PMU/BMU, alternating current (AC) adapter/Power Supply Unit (PSU) and/or battery, allowing remote diagnostics and remediation over network(s), etc.

For example, EC/BMC may implement operations for interfacing with power adapter/PSU in managing power for IHS 900. Such operations may be performed to determine the power status of IHS 900, such as whether IHS 900 is operating from AC adapter/PSU and/or battery.

Firmware instructions utilized by EC/BMC may also be used to provide various core operations of IHS 900, such as power management and management of certain modes of IHS 900 (e.g., turbo modes, maximum operating clock frequencies of certain components, etc.).

In addition, EC/BMC may implement operations for detecting certain changes to the physical configuration or posture of IHS 900. For instance, when IHS 900 as a 2-in-1 laptop/tablet form factor, EC/BMC may receive inputs from a lid position or hinge angle sensor 910, and it may use those inputs to determine: whether the two sides of IHS 900 have been latched together to a closed position or a tablet position, the magnitude of a hinge or lid angle, etc. In response to these changes, the EC may enable or disable certain features of IHS 900 (e.g., front or rear facing camera, etc.).

In some cases, EC/BMC may be configured to identify any number of IHS postures, including, but not limited to: laptop, stand, tablet, tent, or book. For example, when display(s) 911/912 of IHS 900 is open with respect to a horizontal keyboard portion, and the keyboard is facing up, EC/BMC may determine IHS 900 to be in a laptop posture. When display(s) 911/912 of IHS 900 is open with respect to the horizontal keyboard portion, but the keyboard is facing down (e.g., its keys are against the top surface of a table), EC/BMC may determine IHS 900 to be in a stand posture.

When the back of display(s) is closed against the back of the keyboard portion, EC/BMC may determine IHS 900 to be in a tablet posture. When IHS 900 has two display(s) 911/912 open side-by-side, EC/BMC may determine IHS 900 to be in a book posture. When IHS 900 has two displays open to form a triangular structure sitting on a horizontal surface, such that a hinge between the displays is at the top vertex of the triangle, EC/BMC may determine IHS 900 to be in a tent posture. In some implementations, EC/BMC may also determine if display(s) 911/912 of IHS 900 are in a landscape or portrait orientation.

In some cases, an EC/BMC may be installed as a Trusted Execution Environment (TEE) component to the motherboard of IHS 900.

Additionally, or alternatively, EC/BMC may be configured to calculate hashes or signatures that uniquely identify individual components of IHS 900. In such scenarios, EC/BMC may calculate a hash value based on the configuration of a hardware and/or software component coupled to IHS 900. For instance, EC/BMC may calculate a hash value based on all firmware and other code or settings stored in an onboard memory of a hardware component.

Hash values may be calculated as part of a trusted process of manufacturing IHS 200 and may be maintained in secure storage as a reference signature. EC/BMC may later recalculate the hash value for a component may compare it against the reference hash value to determine if any modifications have been made to the component, thus indicating that the component has been compromised. In this manner, EC/BMC may validate the integrity of hardware and software components installed in IHS 900.

In various embodiments, IHS 900 may be coupled to an external power source (e.g., AC outlet or mains) through AC adapter/PSU. AC adapter/PSU may include an adapter portion having a central unit (e.g., a power brick, wall charger, or the like) configured to draw power from an AC outlet via a first electrical cord, convert the AC power to direct current (DC) power, and provide DC power to IHS 900 via a second electrical cord.

Additionally, or alternatively, AC adapter/PSU may include an internal or external power supply portion (e.g., a switching power supply, etc.) connected to the second electrical cord and configured to convert AC to DC. AC adapter/PSU may also supply a standby voltage, so that most of IHS 900 can be powered off after preparing for hibernation or shutdown, and powered back on by an event (e.g., remotely via wake-on-LAN, etc.). In general, AC adapter/PSU may have any specific power rating, measured in volts or watts, and any suitable connectors.

IHS 900 may also include internal or external battery. Battery may include, for example, a Lithium-ion or Li-ion rechargeable device capable of storing energy sufficient to power IHS 900 for an amount of time, depending upon the IHS's workloads, environmental conditions, etc. In some cases, a battery pack may also contain temperature sensors, voltage regulator circuits, voltage taps, and/or charge-state monitors.

A power Management Unit (PMU) can governs power functions of IHS 900, including AC adapter/PSU and battery. For example, PMU may be configured to: monitor power connections and battery charges, charge battery, control power to other components, devices, or ICs, shut down components when they are left idle, control sleep and power functions ("on" and "off"), manage interfaces for built-in keypad and touchpads, regulate real-time clocks (RTCs), etc.

In some implementations, PMU may include one or more Power Management Integrated Circuits (PMICs) configured to control the flow and direction or electrical power in IHS 900. Particularly, a PMIC may be configured to perform battery management, power source selection, voltage regulation, voltage supervision, undervoltage protection, power sequencing, and/or charging operations. It may also include a DC-to-DC converter to allow dynamic voltage scaling, or the like.

Additionally, or alternatively, PMU may include a Battery Management Unit (BMU) (referred to collectively as "PMU/BMU"). AC adapter/PSU may be removably coupled to a battery charge controller within PMU/BMU to provide IHS 900 with a source of DC power from battery cells within battery (e.g., a lithium ion (Li-ion) or nickel metal hydride (NiMH) battery pack including one or more rechargeable batteries). PMU/BMU may include non-volatile memory and it may be configured to collect and store battery status, charging, and discharging information, and to provide that information to other IHS components.

Examples of information collected and stored in a memory within PMU/BMU may include, but are not limited to: operating conditions (e.g., battery operating conditions including battery state information such as battery current amplitude and/or current direction, battery voltage, battery charge cycles, battery state of charge, battery state of health, battery temperature, battery usage data such as charging and discharging data; and/or IHS operating conditions such as processor operating speed data, system power management and cooling system settings, state of "system present" pin signal), environmental or contextual information (e.g., such as ambient temperature, relative humidity, system geolocation measured by GPS or triangulation, time and date, etc.), and BMU events.

Examples of BMU events may include, but are not limited to: acceleration or shock events, system transportation events, exposure to elevated temperature for extended time periods, high discharge current rate, combinations of battery voltage, battery current and/or battery temperature (e.g., elevated temperature event at full charge and/or high voltage causes more battery degradation than lower voltage), etc.

In some embodiments, power draw measurements may be conducted with control and monitoring of power supply via PMU/BMU. Power draw data may also be monitored with respect to individual components or devices of IHS 900. Whenever applicable, PMU/BMU may administer the execution of a power policy, or the like.

IHS 900 may also include one or more fans configured to cool down one or more components or devices of IHS 900 disposed inside a chassis, case, or housing. Fan(s) may include any fan inside, or attached to, IHS 900 and used for active cooling. Fan(s) may be used to draw cooler air into the case from the outside, expel warm air from inside, and/or move air across a heat sink to cool a particular IHS component. In various embodiments, both axial and sometimes centrifugal (blower/squirrel-cage) fans may be used.

In other embodiments, IHS 900 may not include all the components shown in FIG. 9. In other embodiments, IHS 900 may include other components in addition to those that are shown in FIG. 9. Furthermore, some components that are represented as separate components in FIG. 9 may instead be integrated with other components, such that all or a portion of the operations executed by the illustrated components may instead be executed by the integrated component.

For example, in various embodiments described herein, host processor(s) 901 and/or other components of IHS 900 (e.g., chipset 902, display/touch controller(s) 904, communication interface(s) 905, EC/BMC, etc.) may be replaced by discrete devices within a heterogenous computing platform (e.g., a System-On-Chip or "SoC"). As such, IHS 900 may assume different form factors including, but not limited to: servers, workstations, desktops, laptops, appliances, video game consoles, tablets, smartphones, etc.

Figure 10:
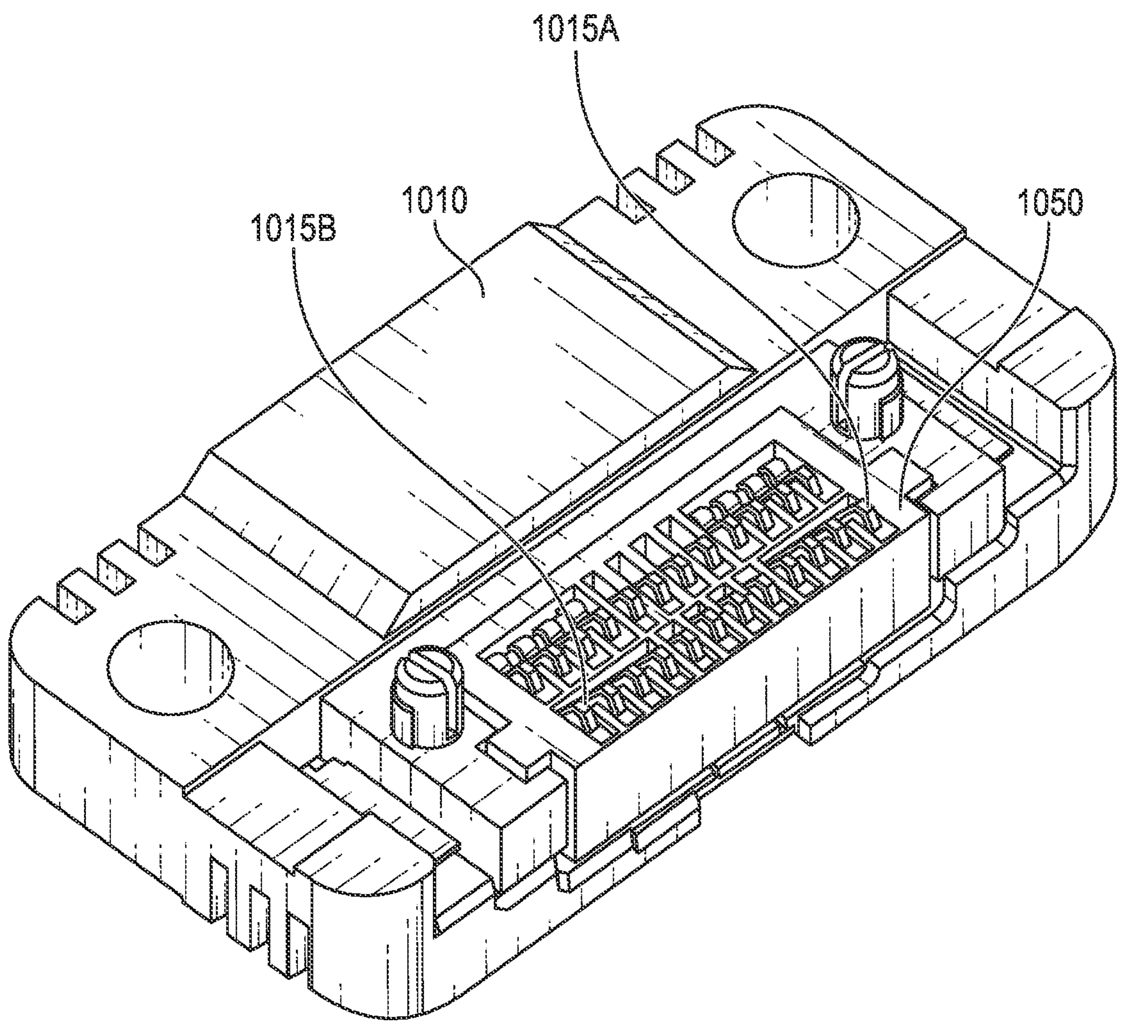
FIG. 10 is another bottom perspective view of another slightly different design of the USB connector assembly showing the spring contacts, according to some embodiments.

FIG. 10 is another bottom perspective view of another slightly different design of the USB connector assembly showing the spring contacts, according to some embodiments. As depicted in FIG. 10, and according to some embodiments, a host USB connector port is mechanically secured within the mounting bracket. In particular, FIG. 10 depicts the spring contacts, including a Type-C ground contact (A1) 1015*a*, and a Type-C ground contact (A12) 1015*b*, housed within a plastic spring contact holder 1050 on the underside of the mounting bracket 1010, according to some embodiments. In some embodiments, the spring contacts are configured to electrically connect to corresponding ones of a plurality of electrical contact pads 130 of the PCB 100, where an individual spring contact of the plurality of spring contacts applies a contact force to a corresponding one of the electrical contact pads of the PCB upon assembly of the mounting bracket onto the PCB.

Figure 11:
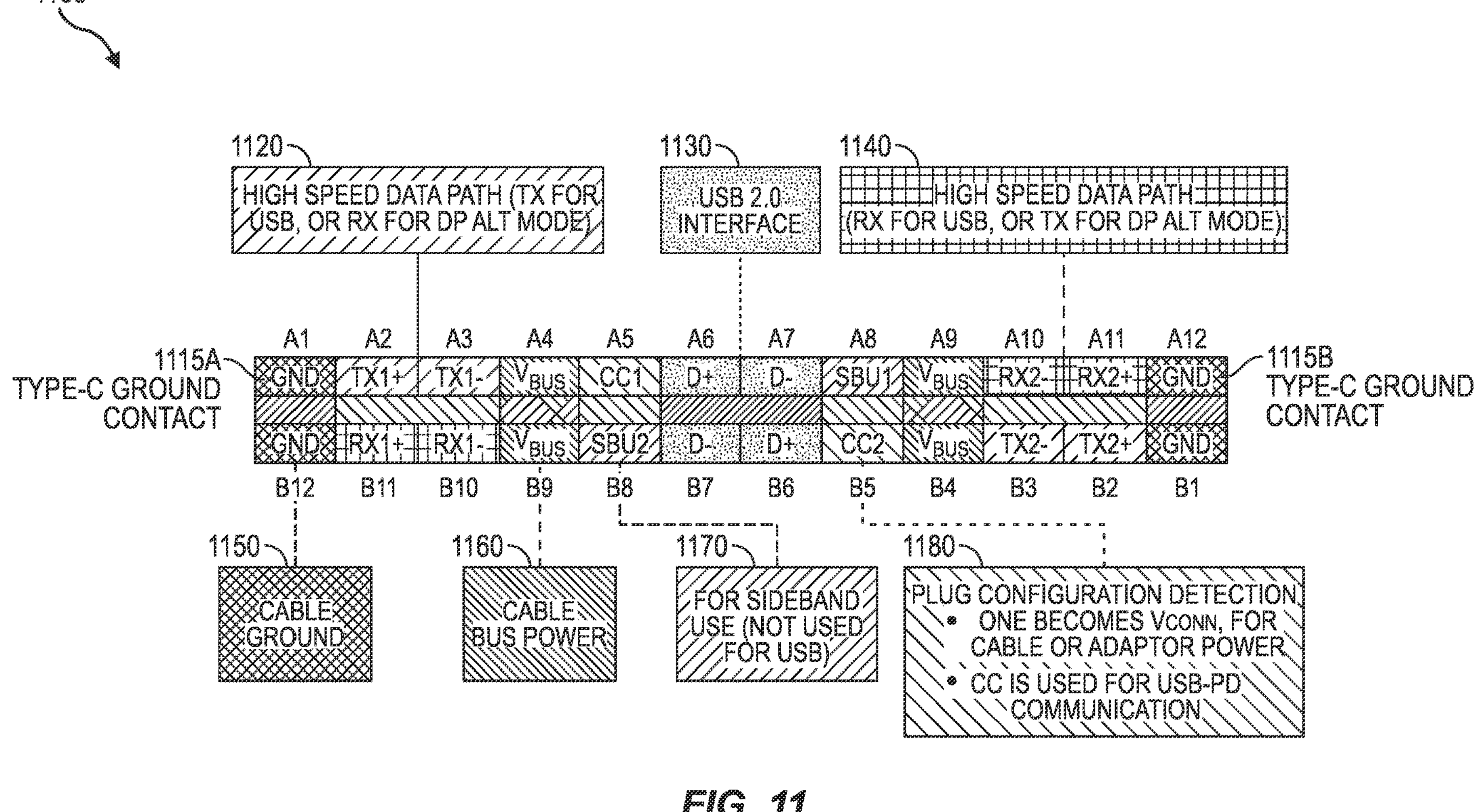
FIG. 11 is a diagram depicting the pin layout and pin functionality of a USB Type-C specification connector, according to some embodiments.

FIG. 11 is a diagram 1100 depicting the pin layout and pin functionality of a USB Type-C specification connector, according to some embodiments. FIG. 11 shows the 24 pins of the USB Type-C connector, including pins A1-A12 on the top row and B12-B1 on the bottom row. The 24 pins of the USB Type-C connector include multiple different categories of pins. The USB Type-C connector features four power pins 1160 (A4, A9, B4, B9) and four ground pins 1150 (A1, A12, B1, B12). These four ground pins include ground contact pin A1 1115*a* and ground contact pin A12 1115*b*. The USB Type-C connector also features two differential pairs 1130 (A6, A7, B6, B7) (connected together on some devices) for legacy USB 2.0 high-speed data. The USB Type-C connector also features four shielded differential pairs for Enhanced SuperSpeed data (A2, A3, A10, A11, B2, B3, B10, B11). These shielded differential pairs include two high speed data transmit pairs 1120 (which could be RX pairs in DisplayPort ("DP") alternate mode), and two high-speed data receive pairs 1140 (which could be RX pairs in DP alternate mode). The USB Type-C connector also features two Sideband Use ("SBU") pins 1170 (A8, B8), and two Configuration Channel ("CC") pins 1180 (A5, B5). The CC pins can be used for plug configuration detection, in some embodiments. One pin can become VCONN, for cable or adaptor power. The CC can be used for USB power delivery ("PD") communication.

Manufacturers of IHS and PCBs (e.g., MBs) can, in some circumstances, dispatch a complete MB assembly with one or more soldered on CPUs and soldered memory. After transfer to a customer, sometimes a customer will call technical support with an issue. Sometimes a technical support call from the end customer points to a mechanically loose, and/or electrically permanent or intermittent (e.g., loss of docking and/or charging) behavior for the USB connection. This can be due to a suspected failed soldered joint (from mechanical overstress, for example) on a Type-C USB connector. Existing USB connectors (e.g., Type-C connectors) which are soldered on to the PCB provide no diagnostic loop which allows a root cause to be diagnosed with a high enough certainty, in order to determine whether the failure of the MB is related to the USB connector, or whether the failure of the MB is related to another component on the PCB.

However, with any future utilization of the Compression USB connector (e.g., Compression Type-C USB connector), which eliminates the solder joints, such a Compression USB connector would be able to be easily replaced as a field replaceable unit ("FRU") with the removal of two screws. Therefore, a built-in diagnostic tool, that is able to determine if either the MB or the Type-C FRU is defective, would be beneficial whenever USB connector (e.g., Type-C USB connector) failure symptoms occur. This can be needed to avoid the unnecessary dispatch of a MB, when only the replacement of the USB connector FRU is required. This would minimize MB service stock inventory, which is a high cost, along with the logistics dispatch costs for a new motherboard.

Therefore, some embodiments of the systems and methods to diagnose connectivity of a non-soldered compression USB connectors, described herein, detect the fully mated functionality of the Compression Type-C connector. In some embodiments, the systems and methods detect the fully mated functionality of the Compression Type-C connector using one or more of three different methodologies.

A first methodology can be called the diagnostic surface pad concept, according to some embodiments. In the diagnostic surface pad concept, according to these embodiments, the electrically conductive metal housing contact surface can be utilized to complete a diagnostic conductivity loop, with specially located electrically isolated diagnostic pads located on the PCB, when the Compression Type C connector is fully mated to the PCB with adequate clamping force from the two mounting screws.

A second methodology can be called the diagnostic leaf-spring concept, according to some embodiments. The diagnostic leaf-spring concept, according to these embodiments utilizes a recessed surface in the metal connector housing, to which electrically conductive metal leaf-springs are attached. In some embodiments, these metal leaf-springs are laser-welded. These leaf-springs can be utilized to complete a diagnostic conductivity loop, with specially located electrically isolated diagnostic pads located on the PCB, when the Compression Type C connector is fully mated to the PCB with adequate clamping force from the two mounting screws.

A third methodology can be called the diagnostic contact concept, according to some embodiments. With the diagnostic contact concept, according to these embodiments, additional diagnostic contacts can be placed adjacent to the Compression Type-C specification ground contacts (e.g., A1 & A12). Each of the diagnostic contacts can share a common metal stamping bridge with the Type-C USB ground contacts (e.g., A1 or A12), such they are connected to each other, and the electrical resistance relative to each other is less than 1 Ohm. The contact geometry of the outer adjacent diagnostic pins are slightly shorter than the inner A1 & A12, such that the diagnostic contacts come in mechanical/electrical contact with the PCB diagnostic pads when the Compression Type C connector is fully mated to the PCB with adequate clamping force from the two mounting screws.

Therefore, some embodiments of the systems and methods to diagnose connectivity of a non-soldered compression USB connectors allows manufacturers or IHS servicers to remotely diagnose the mechanical and/or electrical condition of a compression connector to determine a service path.

Figure 12:
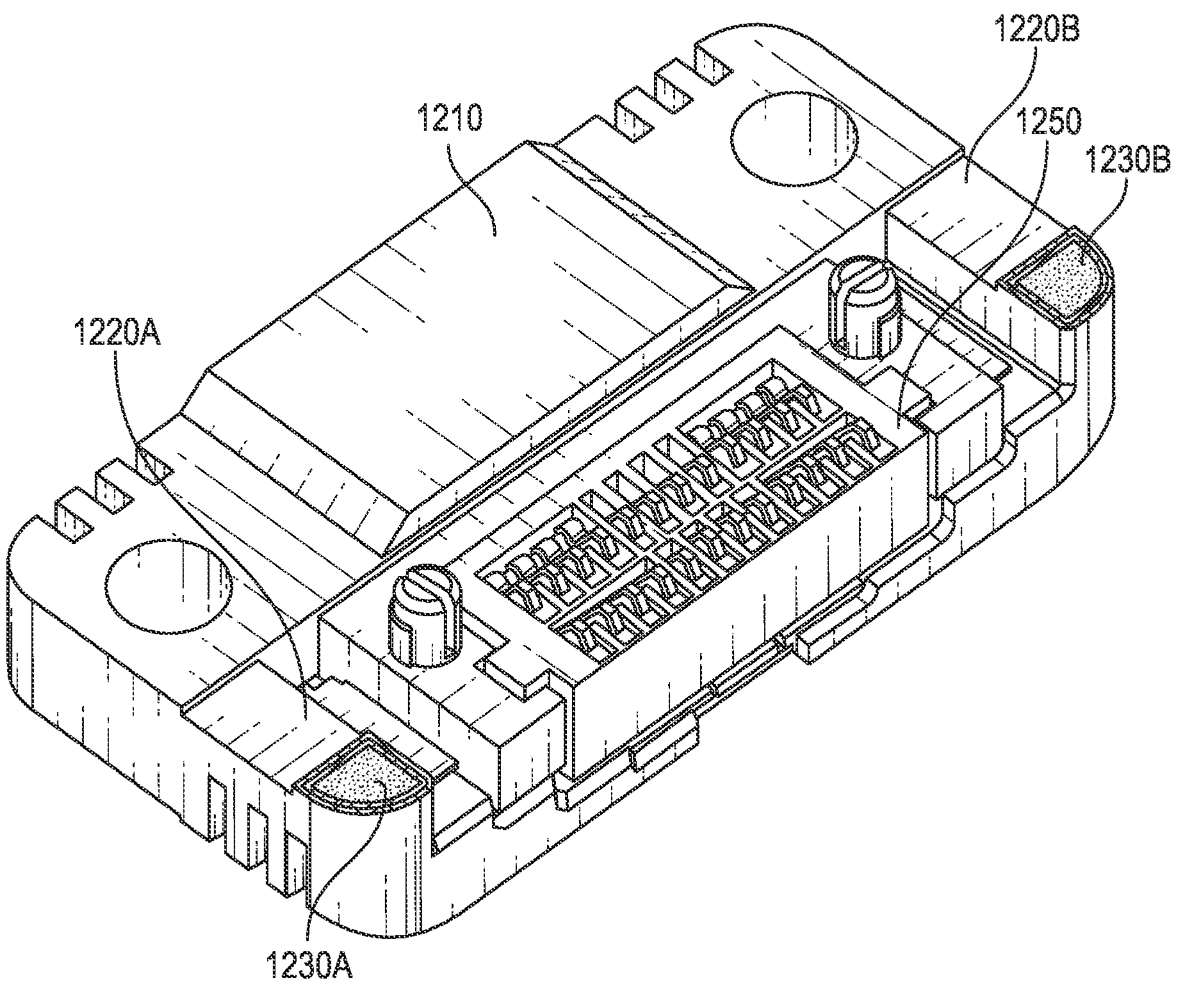
FIG. 12 is a bottom perspective view of a USB connector assembly depicting outer rear standoff diagnostic surface pads, according to some embodiments.

FIG. 12 is a bottom perspective view of a USB connector assembly 1210 depicting outer rear standoff diagnostic surface pads (1230*a*, 1230*b*), according to some embodiments. The front of the USB connector assembly 1210 is the side where the male USB plug plugs into the female receptacle. That side is the side that the figure reference number 1210 points to. The rear half of the USB connector assembly 1210 includes the spring contacts housed within a plastic spring contact holder 1250 on the underside of the mounting bracket, according to some embodiments. The USB connector assembly 1210 also includes two recessed steps (1220*a*, 1220*b*) next to the two respective outer rear standoff diagnostic surface pads (1230*a*, 1230*b*), in order to electrically isolate the outer rear standoff diagnostic surface pads (1230*a*, 1230*b*) from the rest of the USB connector assembly 1210.

Figure 13:
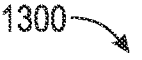
FIG. 13 is a layout diagram of a PCB pad footprint of a PCB for connection to a USB Type-C specification connector, depicting PCB diagnostic surface pads for connection to outer rear standoff diagnostic surface pads of the USB Type-C connector, according to some embodiments.
Figure 13:
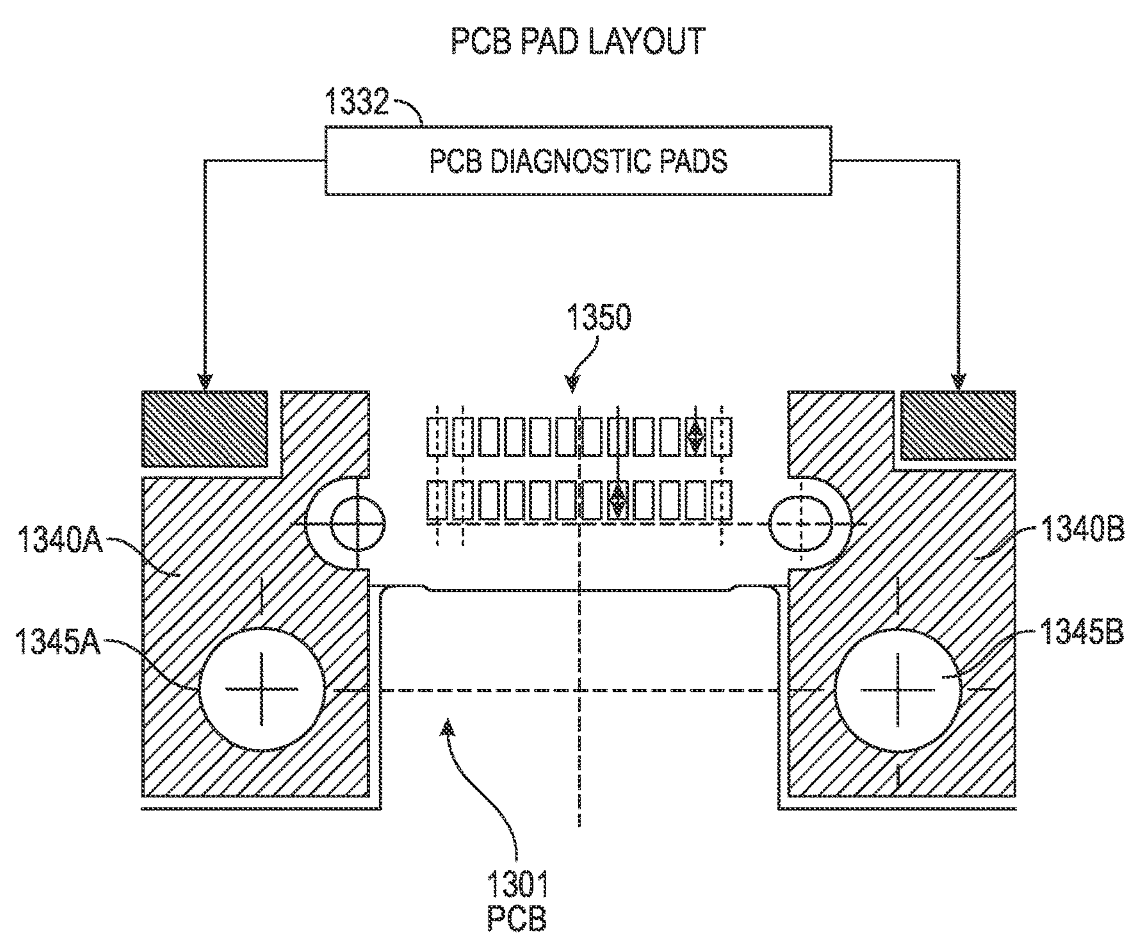

FIG. 13 is a layout diagram of a PCB pad footprint 1300 of a PCB for connection to a USB Type-C specification connector, depicting PCB diagnostic surface pads 1332 for connection to outer rear standoff diagnostic surface pads (1230*a*, 1230*b*) of the USB Type-C connector assembly 1210, according to some embodiments. In some embodiments, the spring contacts of the USB Type-C connector assembly 1210 are configured to electrically connect to corresponding ones of a plurality of electrical contact pads 1350 of the PCB 1301, where an individual spring contact of the plurality of spring contacts applies a contact force to a corresponding one of the electrical contact pads of the PCB upon assembly of the mounting bracket onto the PCB. When the USB connector assembly 1210 is fully seated on a PCB, the outer rear standoff diagnostic surface pads (1230*a*, 1230*b*) make contact with PCB diagnostic surface pads 1332 on the PCB 1301. FIG. 13 also depicts screw holes (1345*a*, 1345*b*) in the PCB that align with the screw holes of the USB Type-C connector assembly 1210, in order for the USB Type-C connector assembly 1210 to be screwed into the PCB. 1340*a* and 1340*b* depict some regions of the PCB 1301 that do not have electrically conductive material, and so are electrically isolated from the PCB diagnostic surface pads 1332.

Figures 14A, 14B:
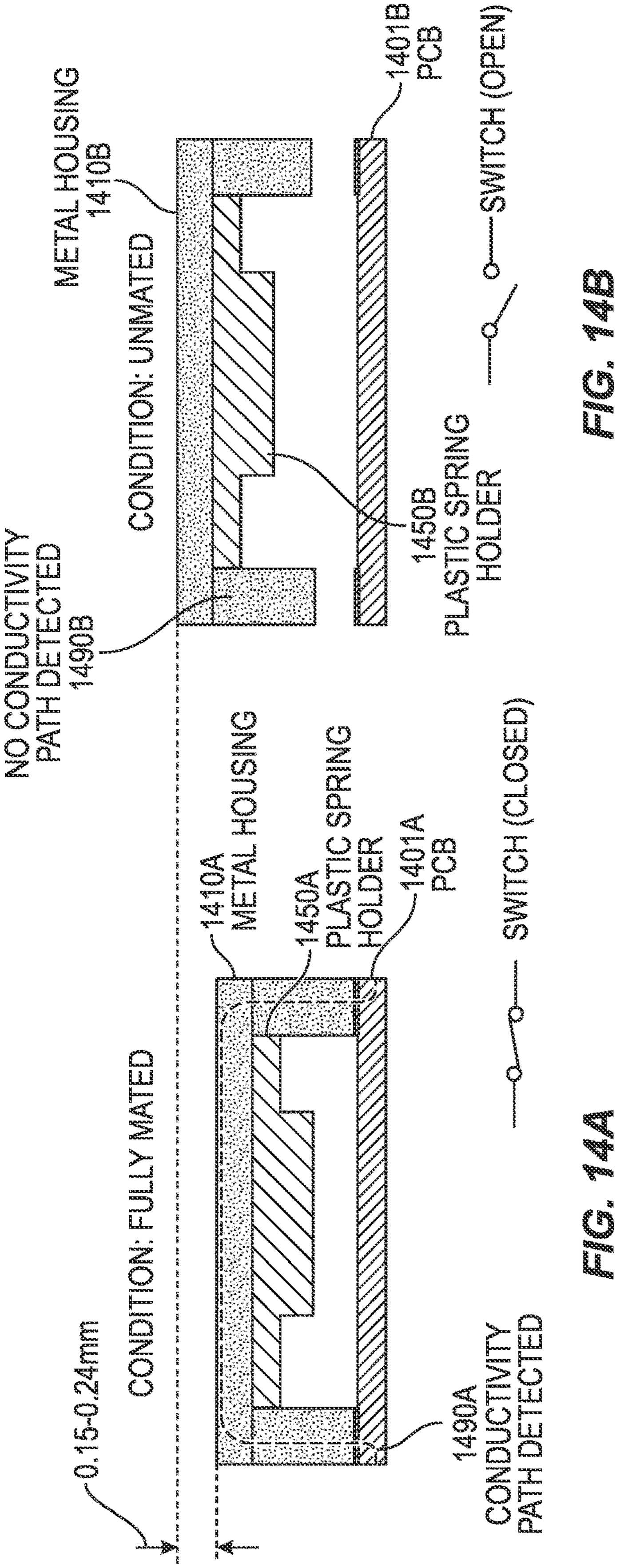
FIG. 14A is a diagram depicting a USB connector assembly fully mated to a PCB such that the outer rear standoff diagnostic surface pads form a conductivity path through the metal housing of the USB connector assembly, according to some embodiments.
FIG. 14B is a diagram depicting a USB connector assembly unmated to a PCB such that the outer rear standoff diagnostic surface pads do not form a conductivity path through the metal housing of the USB connector assembly, according to some embodiments.

FIG. 14A is a diagram depicting a USB connector assembly with a metal housing 1410*a* fully mated to a PCB 1401*a* such that the outer rear standoff diagnostic surface pads (1230*a*, 1230*b*) form a conductivity path 1490*a* through the metal housing 1410*a* of the USB connector assembly, according to some embodiments. The USB connector assembly includes the spring contacts housed within a plastic spring contact holder 1450*a* on the underside of the mounting bracket, according to some embodiments. When the USB connector assembly is fully seated, an electrical trace 1490*a* goes through the PCB 1401*a*, through a PCB diagnostic surface pad 1332, up a pedestal on the USB connector assembly, across the metal housing 1410*a* and back down to the other PCB diagnostic surface pad 1332, in order to complete a loop, according to some embodiments. Therefore, the electrical circuit including the metal housing 1410*a* of the USB connector assembly is closed, as depicted by the "switch (closed)" text and circuit diagram of FIG. 14A.

FIG. 14B is a diagram depicting a USB connector assembly with a metal housing 1410*b* unmated to a PCB 1401*b*, such that the outer rear standoff diagnostic surface pads do not form a conductivity path through the metal housing of the USB connector assembly, according to some embodiments. The USB connector assembly includes the spring contacts housed within a plastic spring contact holder 1450*b* on the underside of the mounting bracket, that would also be unmated to the PCB diagnostic surface pad 1332 of the PCB 1401*b*, according to some embodiments. If the USB connector assembly is at least between 0.15 and 0.24 mm from the PCB 1401*b*, then it becomes unmated. In FIG. 14B, when the USB connector assembly is not fully seated, there is no conductivity path 1490*b* through the PCB 1401*b*, through a PCB diagnostic surface pad 1332, up a pedestal on the USB connector assembly, across the metal housing 1410*b* and back down to the other PCB diagnostic surface pad 1332, according to some embodiments. Therefore, the electrical circuit including the metal housing 1410*b* of the USB connector assembly is open, as depicted by the "switch (open)" text and circuit diagram of FIG. 14B.

Figure 15:
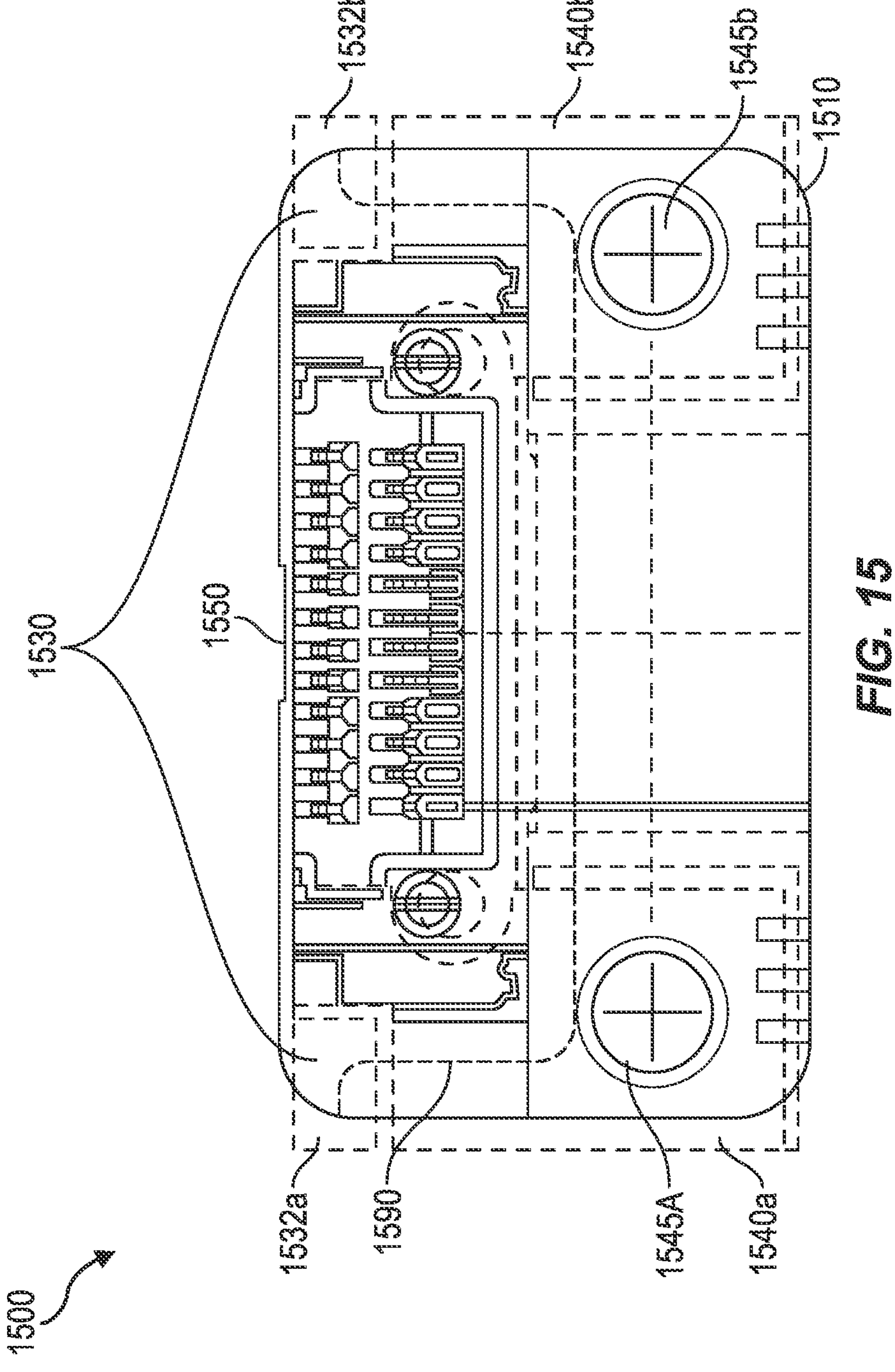
FIG. 15 is an overlay diagram of a USB connector assembly placed on a PCB pad footprint of a PCB, depicting an outer rear standoff diagnostic surface pad conductivity path continuity, with the outer rear diagnostic surface pads of the USB connector assembly fully seated on the PCB, according to some embodiments.

FIG. 15 is an overlay diagram 1500 of a USB connector assembly 1510 placed on a PCB pad footprint (1540*a*, 1540*b*) of a PCB, depicting an outer rear standoff diagnostic surface pad conductivity path continuity 1590, with the outer rear diagnostic surface pads 1530 of the USB connector assembly 1510 fully seated on the PCB diagnostic surface pad (1532*a*, 1532*b*) of the PCB, according to some embodiments. In some embodiments, the spring contacts 1550 of the USB Type-C connector assembly 1510 are configured to electrically connect to corresponding ones of a plurality of electrical contact pads of the PCB, where an individual spring contact of the plurality of spring contacts applies a contact force to a corresponding one of the electrical contact pads of the PCB upon assembly of the mounting bracket onto the PCB. FIG. 15 also depicts screw holes (1545*a*, 1545*b*) in the PCB that align with the screw holes of the USB Type-C connector assembly 1510, in order for the USB Type-C connector assembly 1510 to be screwed into the PCB. 1540*a* and 1540*b* depict some regions of the PCB that do not have electrically conductive material, and so are electrically isolated from the PCB diagnostic surface pads (1532*a*, 1532*b*). When the USB connector assembly 1510 is fully seated, an electrical trace 1590 goes through the PCB, through a PCB diagnostic surface pad 1532*a*, through an outer rear diagnostic surface pads 1530 of the USB connector assembly 1510, up a pedestal on the USB connector assembly 1510, across the metal housing, to the other outer rear diagnostic surface pads 1530 of the USB connector assembly 1510, and back down to the other PCB diagnostic surface pad 1532*b*, in order to complete a loop, according to some embodiments.

Figure 16:
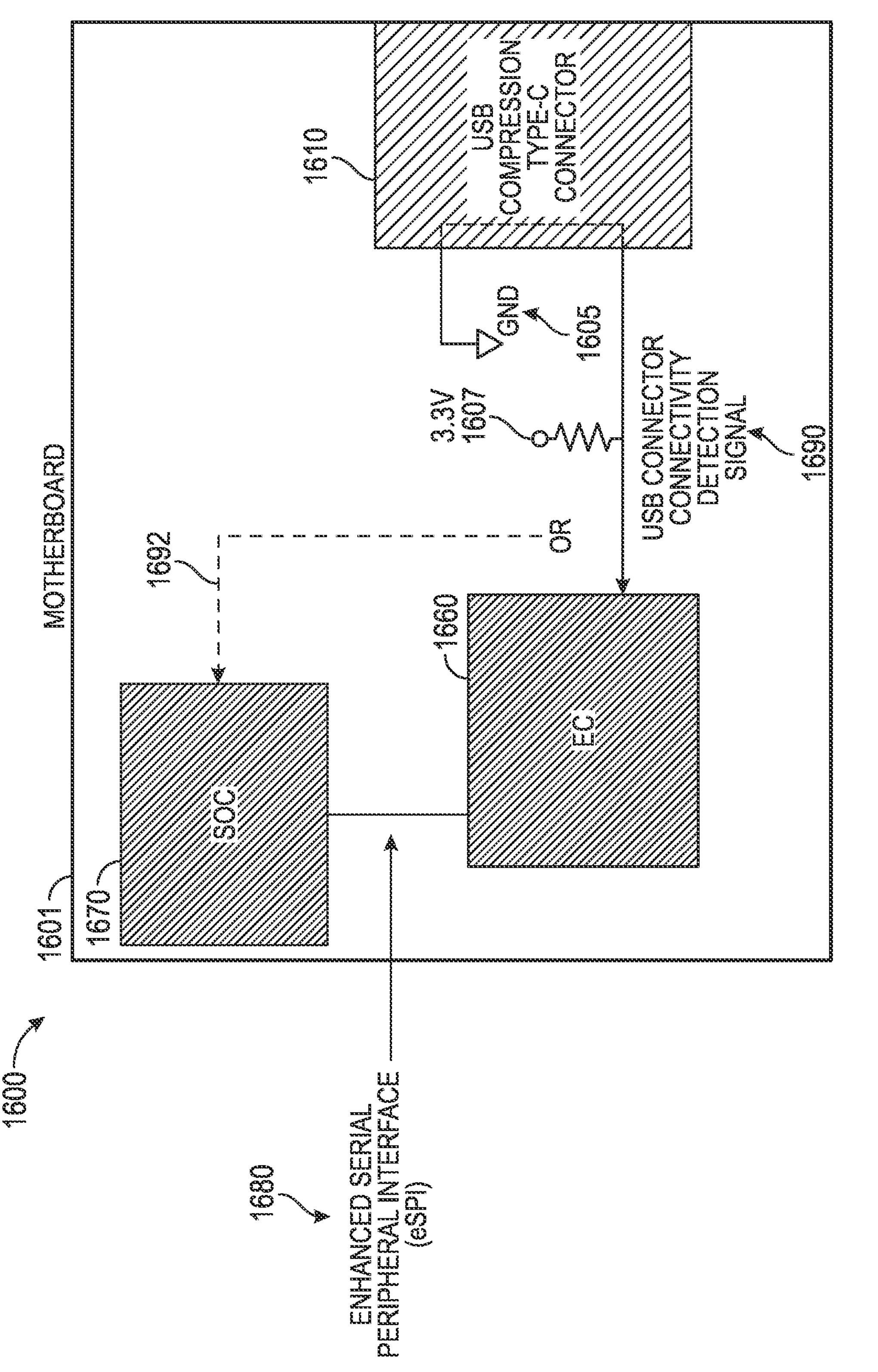
FIG. 16 is an electrical diagram depicting USB diagnostic connectors forming an electrically conductive diagnostic ground loop, in order to diagnose a USB compression connector mechanical and/or electrical condition, according to some embodiments.

FIG. 16 is an electrical diagram 1600 depicting a motherboard ("MB") 1601 including USB diagnostic connectors, of a USB compression Type-C connector assembly 1610, forming an electrically conductive diagnostic ground loop, in order to diagnose a USB compression connector mechanical and/or electrical condition, according to some embodiments. The PCB diagnostic surface pad (1532*a*, 1532*b*) of the MB 1601 will make a continuity path connection through the outer rear diagnostic surface pads 1530 and the metal housing of the USB compression Type-C connector assembly 1610. One of the PCB diagnostic surface pad would be tied to ground (e.g., GND 1605) on the system side. The other PCB diagnostic surface pad would be tied to a USB connector connectivity detection signal 1690 that is connected to a logic-high voltage (e.g., 3.3V 1607) through a high-ohmage resistor. This USB connector connectivity detection signal 1690 can be routed to an embedded controller ("EC") 1660, or to a system-on-a-chip ("SoC") 1670 via signal 1692. Either way the USB connector connectivity detection signal (1690 or 1692) has a pull-up circuit (including 1607) associated with it. Therefore, if the USB compression Type-C connector assembly 1610 is fully seated, this USB connector connectivity detection signal (1690 or 1692) should be logic low, since the GND 1605 will drain the small current from 1607 that travels across the high-ohmage resistor. However, if either side of the USB compression Type-C connector assembly 1610 were to lift off the MB 1601, being an indication that the USB compression Type-C connector assembly 1610 is not fully seeded, then this USB connector connectivity detection signal (1690 or 1692) would be a logic-high, since the logic-high voltage power (e.g., 3.3V 1607) would pull the voltage up to a logic-high. It should be noted that the USB connector connectivity detection signal (1690, 1692) can connect to a General Purpose I/O ("GPIO") input (e.g., GPIOxxx where "xxx" represents a number) of the EC 1660 or SOC 1670.

Figure 17:
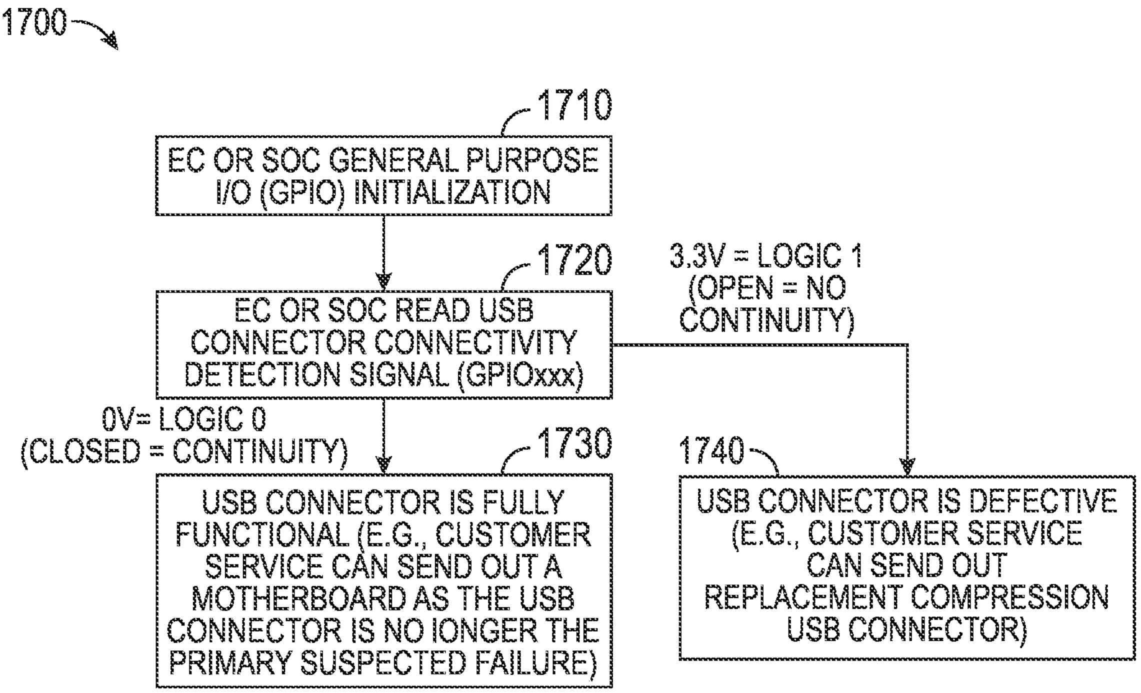
FIG. 17 is a flowchart depicting a methodology to detect whether a USB compression connector, which is mated to a PCB pad footprint of a PCB, is functional or defective, according to some embodiments.

FIG. 17 is a flowchart 1700 depicting a methodology to detect whether a USB compression connector, which is mated to a PCB pad footprint of a PCB, is functional or defective, according to some embodiments. The flowchart 1700 begins at block 1710, where the EC 1660 or SOC 1670 initializes a General Purpose I/O ("GPIO") input (e.g., GPIOxxx). The flowchart then transitions to block 1720, where the EC 1660 or SOC 1670 reads the USB connector connectivity detection signal (1690, 1692), which is routed to the GPIO input, such as at input GPIOxxx. If the USB connector connectivity detection signal is a logic-low (e.g., 0V or logic 0), then this means that the USB compression Type-C connector assembly 1610 is fully seated. Therefore, the flowchart transitions to block 1730 where the USB connector is fully functional. In a customer service setting, this would mean that customer service can send out a MB as a replacement, since the USB connector would no longer be a primary suspected failure. If the USB connector connectivity detection signal is a logic-high (e.g., 3.3V or logic 1), then this means that the USB compression Type-C connector assembly 1610 is not fully seated. Therefore, the flowchart transitions to block 1740 where the USB connector is defective. In a customer service setting, this would mean that customer service can send out a replacement USB connector, instead of sending out an entire new MB.

Therefore, the USB connector connectivity detection signal (1690, 1692) can inform a manufacturer or IHS servicer whether a customer was having functional failures or some issue with their connector, for example. Then the manufacturer or IHS servicer can use that as part of a diagnosis in determining if just the connector came unseated, and whether it needs to be retightened or replaced, or is there something else going on.

Figure 18:
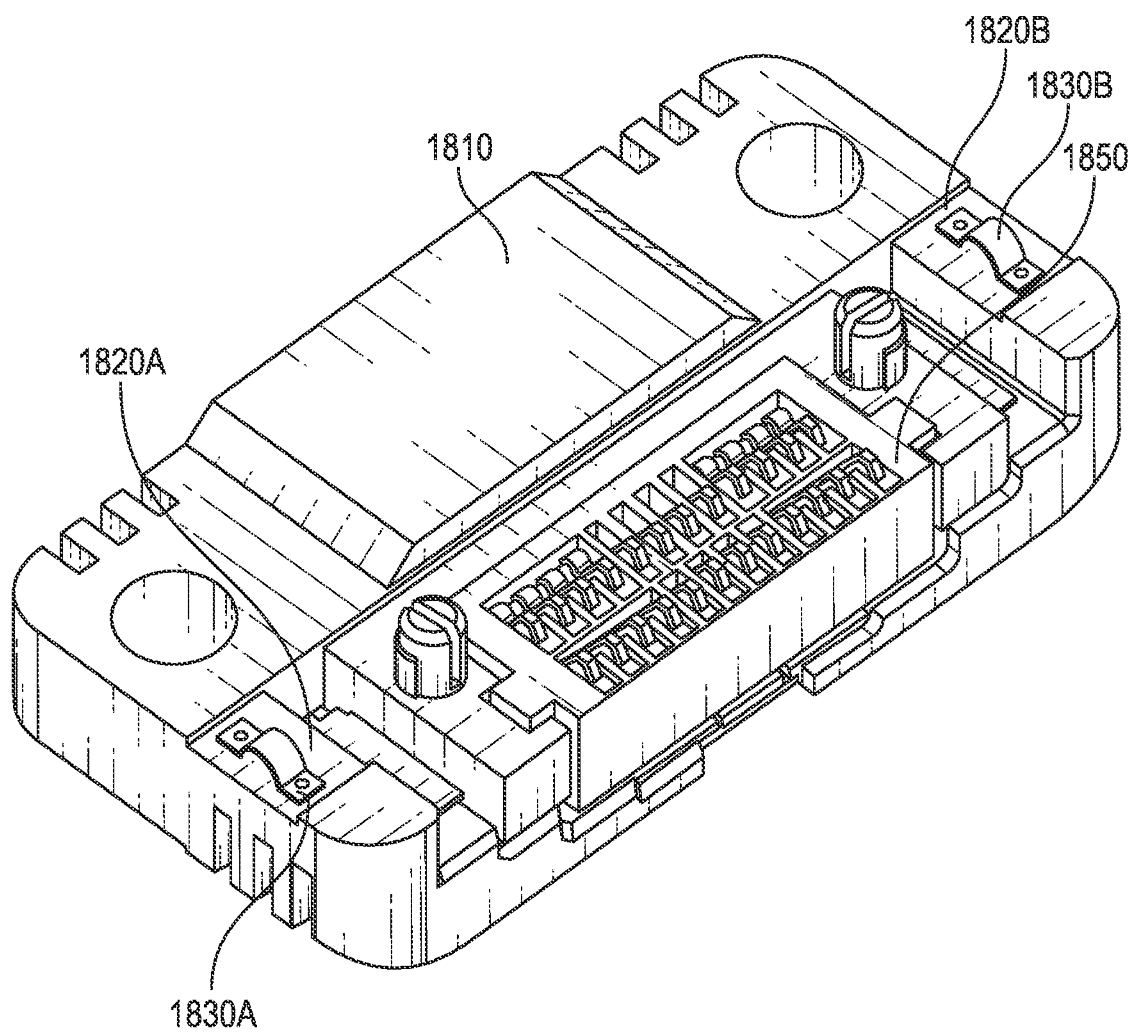
FIG. 18 is a bottom perspective view of a USB connector assembly depicting diagnostic leaf springs, according to some embodiments.

FIG. 18 is a bottom perspective view of a USB connector assembly 1810 depicting diagnostic leaf springs (1830*a*, 1830*b*), according to some embodiments. The front of the USB connector assembly 1810 is the side where the male USB plug plugs into the female receptacle. That side is the side that the figure reference number 1810 points to. The rear half of the USB connector assembly 1810 includes the spring contacts housed within a plastic spring contact holder 1850 on the underside of the mounting bracket, according to some embodiments. The USB connector assembly 1810 also includes two recessed steps (1820*a*, 1820*b*) that contain the two respective diagnostic leaf springs (1830*a*, 1830*b*).

Figure 19:
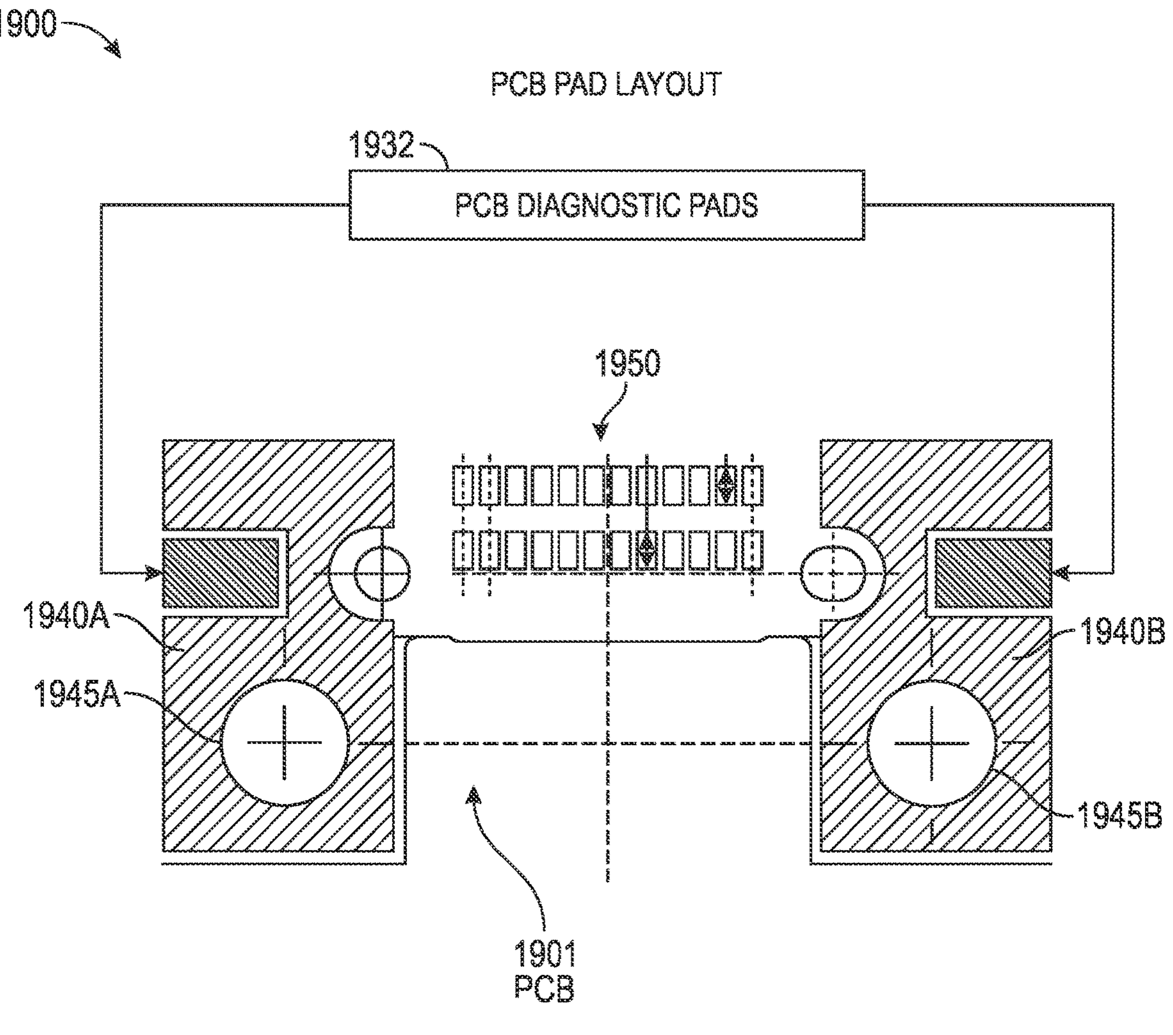
FIG. 19 is a layout diagram of a PCB pad footprint of a PCB for connection to a USB Type-C specification connector, depicting PCB diagnostic surface pads for connection to diagnostic leaf springs of the USB Type-C connector, according to some embodiments.

FIG. 19 is a layout diagram of a PCB pad footprint 1900 of a PCB for connection to a USB Type-C specification connector, depicting PCB diagnostic surface pads 1932 for connection to diagnostic leaf springs (1830*a*, 1830*b*) of the USB Type-C connector assembly 1810, according to some embodiments. In some embodiments, the spring contacts of the USB Type-C connector assembly 1810 are configured to electrically connect to corresponding ones of a plurality of electrical contact pads 1950 of the PCB 1901, where an individual spring contact of the plurality of spring contacts applies a contact force to a corresponding one of the electrical contact pads of the PCB upon assembly of the mounting bracket onto the PCB. When the USB connector assembly 1810 is fully seated on a PCB, the diagnostic leaf springs (1830*a*, 1830*b*) make contact with PCB diagnostic surface pads 1932 on the PCB 1901. FIG. 19 also depicts screw holes (1945*a*, 1945*b*) in the PCB that align with the screw holes of the USB Type-C connector assembly 1810, in order for the USB Type-C connector assembly 1810 to be screwed into the PCB. 1940*a* and 1940*b* depict some regions of the PCB 1901 that do not have electrically conductive material, and so are electrically isolated from the PCB diagnostic surface pads 1932.

Figures 20A, 20B:
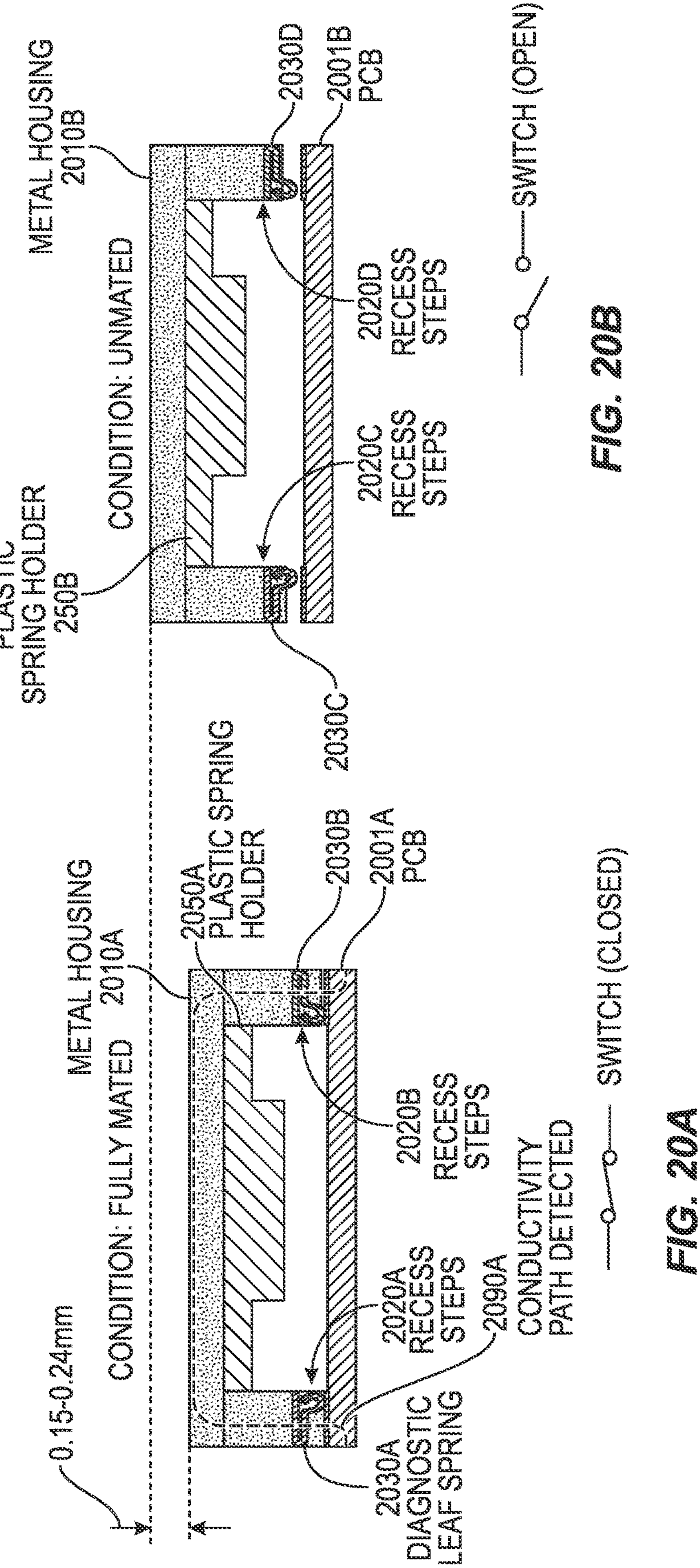
FIG. 20A is a diagram depicting a USB connector assembly fully mated to a PCB such that the diagnostic leaf springs form a conductivity path through the metal housing of the USB connector assembly, according to some embodiments.
FIG. 20B is a diagram depicting a USB connector assembly unmated to a PCB such that the diagnostic leaf springs do not form a conductivity path through the metal housing of the USB connector assembly, according to some embodiments.

FIG. 20A is a diagram depicting a USB connector assembly with a metal housing 2010*a* fully mated to a PCB 2001*a* such that the diagnostic leaf springs (2030*a*, 2030*b*) form a conductivity path 2090*a* through the metal housing 2010*a* of the USB connector assembly, according to some embodiments. The diagnostic leaf springs (2030*a*, 2030*b*) are located in the recessed steps (2020*a*, 2020*b*) of the USB connector assembly. The USB connector assembly includes the spring contacts housed within a plastic spring contact holder 2050*a* on the underside of the mounting bracket, according to some embodiments. When the USB connector assembly is fully seated, an electrical trace 2090*a* goes through the PCB 2001*a*, through a PCB diagnostic surface pad 1932, up a pedestal on the USB connector assembly, across the metal housing 2010*a* and back down to the other PCB diagnostic surface pad 1932, in order to complete a loop, according to some embodiments. Therefore, the electrical circuit including the metal housing 2010*a* of the USB connector assembly is closed, as depicted by the "switch (closed)" text and circuit diagram of FIG. 20A.

FIG. 20B is a diagram depicting a USB connector assembly with a metal housing 2010*b* unmated to a PCB 2001*b*, such that the diagnostic leaf springs (2030*c*, 2030*d*) do not form a conductivity path through the metal housing 2010*b* of the USB connector assembly, according to some embodiments. The diagnostic leaf springs (2030*c*, 2030*c*) are located in the recessed steps (2020*c*, 2020*c*) of the USB connector assembly. The USB connector assembly includes the spring contacts housed within a plastic spring contact holder 2050*b* on the underside of the mounting bracket, that would also be unmated to the PCB diagnostic surface pad 1932 of the PCB 2001*b*, according to some embodiments. If the USB connector assembly is at least between 0.15 and 0.24 mm from the PCB 2001*b*, then it becomes unmated. In FIG. 20B, when the USB connector assembly is not fully seated, there is no conductivity path 2090*b* through the PCB 2001*b*, through a PCB diagnostic surface pad 1932, up a pedestal on the USB connector assembly, across the metal housing 2010*b* and back down to the other PCB diagnostic surface pad 1932, according to some embodiments. Therefore, the electrical circuit including the metal housing 2010*b*, and the diagnostic leaf springs (2030*a*, 2030*b*) of the USB connector assembly is open, as depicted by the "switch (open)" text and circuit diagram of FIG. 20B.

Figure 21:
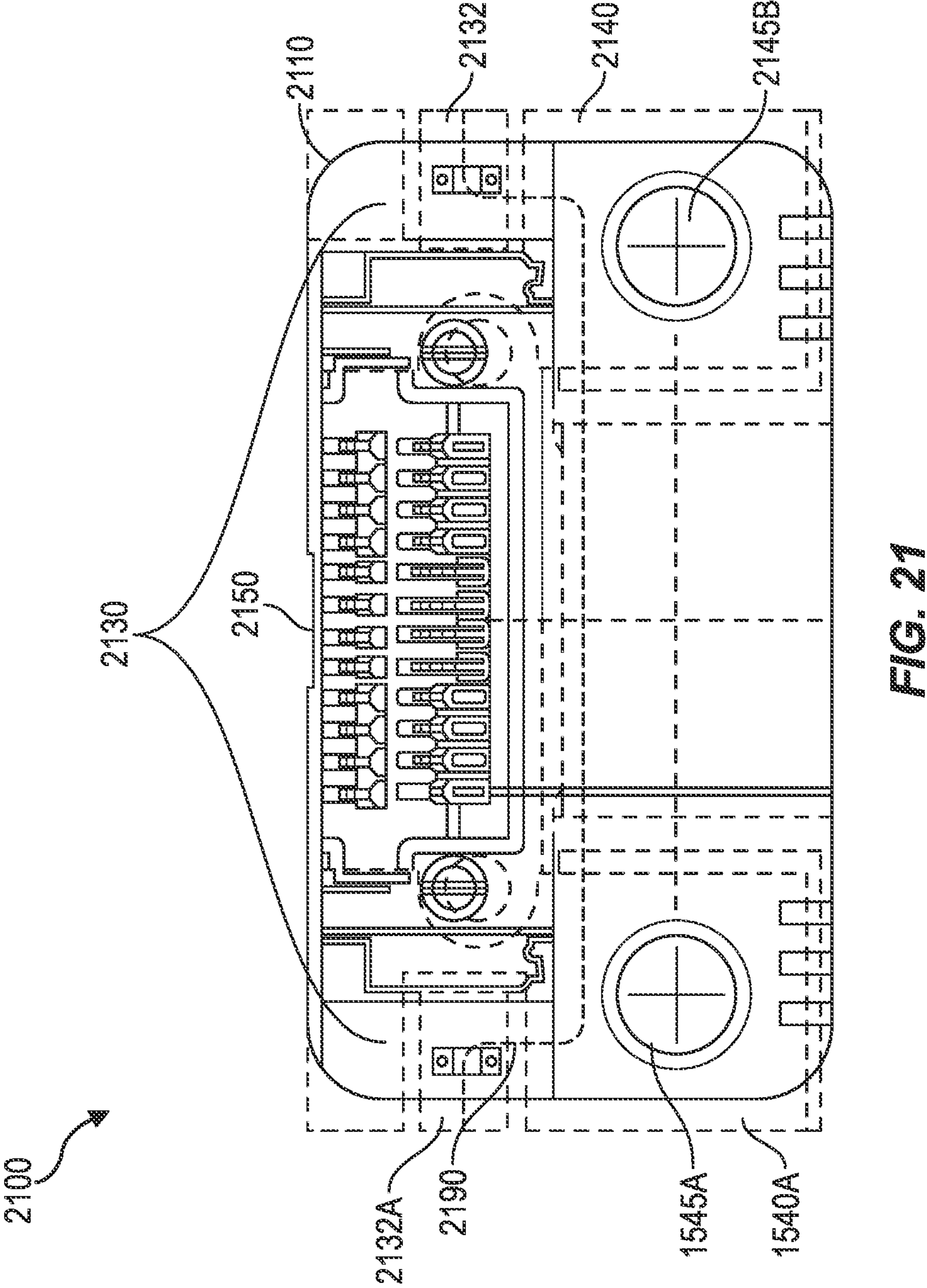
FIG. 21 is an overlay diagram of a USB connector assembly placed on a PCB pad footprint of a PCB, depicting diagnostic leaf spring conductivity path continuity, with the diagnostic leaf springs of the USB connector assembly fully seated on the PCB, according to some embodiments.

FIG. 21 is an overlay diagram 2100 of a USB connector assembly 2110 placed on a PCB pad footprint (2140*a*, 2140*b*) of a PCB, depicting a diagnostic leaf spring conductivity path continuity 2190, with the diagnostic leaf springs 2130 of the USB connector assembly 2110 fully seated on the PCB diagnostic surface pad (2132*a*, 2132*b*) of the PCB, according to some embodiments. In some embodiments, the spring contacts 2150 of the USB Type-C connector assembly 2110 are configured to electrically connect to corresponding ones of a plurality of electrical contact pads of the PCB, where an individual spring contact of the plurality of spring contacts applies a contact force to a corresponding one of the electrical contact pads of the PCB upon assembly of the mounting bracket onto the PCB. FIG. 21 also depicts screw holes (2145*a*, 2145*b*) in the PCB that align with the screw holes of the USB Type-C connector assembly 2110, in order for the USB Type-C connector assembly 2110 to be screwed into the PCB. 2140*a* and 2140*b* depict some regions of the PCB that do not have electrically conductive material, and so are electrically isolated from the PCB diagnostic surface pads (2132*a*, 2132*b*). When the USB connector assembly 2110 is fully seated, an electrical trace 2190 goes through the PCB, through a PCB diagnostic surface pad 2132*a*, through a diagnostic leaf springs 2130 of the USB connector assembly 2110, up a pedestal on the USB connector assembly 2110, across the metal housing, to the other diagnostic leaf springs 2130 of the USB connector assembly 2110, and back down to the other PCB diagnostic surface pad 2132*b*, in order to complete a loop, according to some embodiments.

Figure 22:
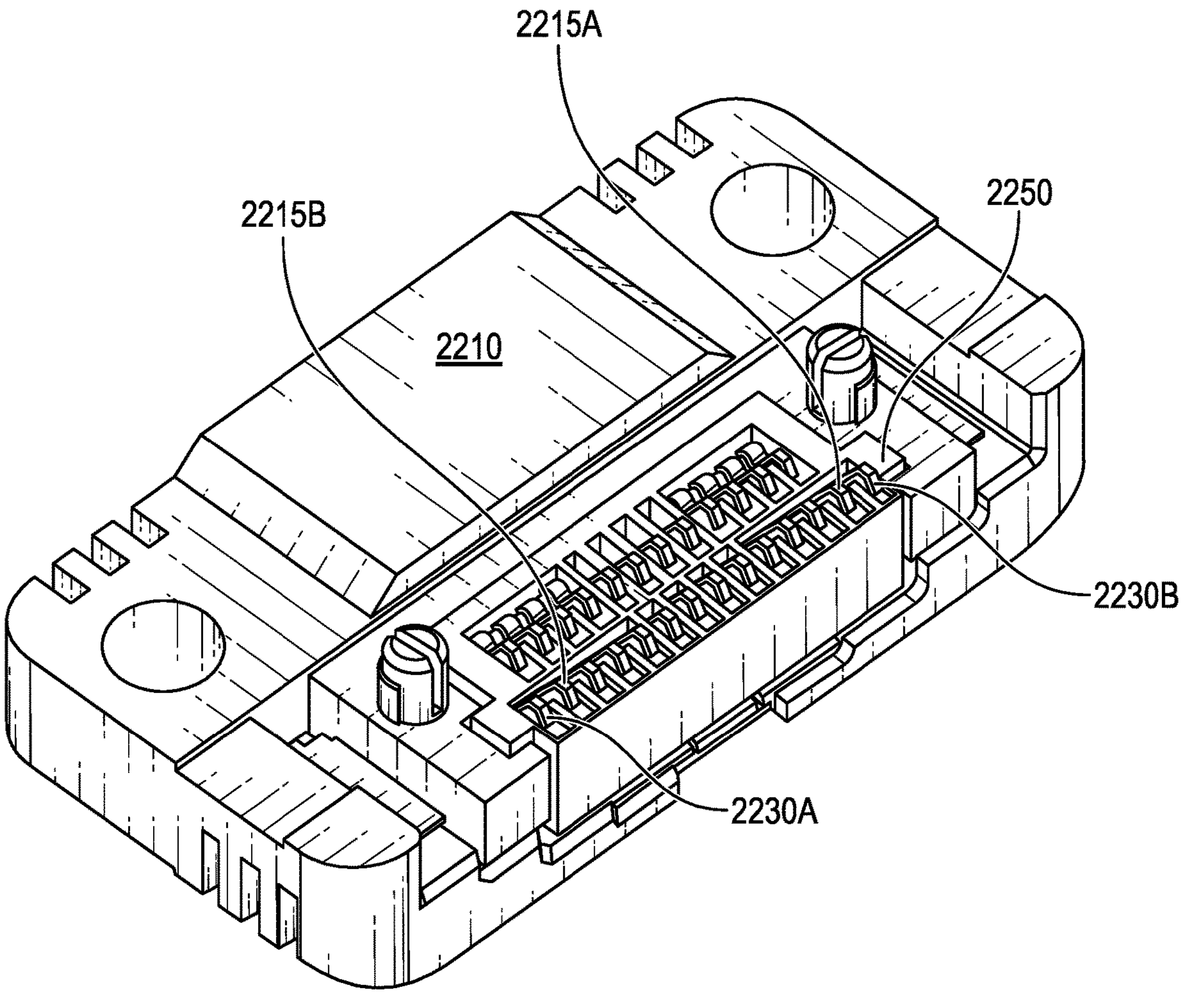
FIG. 22 is a bottom perspective view of a USB connector assembly depicting outer back row extra diagnostic contacts, according to some embodiments.

FIG. 22 is a bottom perspective view of a USB connector assembly 2210 depicting outer back row extra diagnostic contacts (2230*a*, 2230*b*), according to some embodiments. The front of the USB connector assembly 2210 is the side where the male USB plug plugs into the female receptacle. That side is the side that the figure reference number 2210 points to. The rear half of the USB connector assembly 2210 includes the spring contacts housed within a plastic spring contact holder 2250 on the underside of the mounting bracket, according to some embodiments. In particular, FIG. 22 depicts the spring contacts, including a Type-C ground contact (A1) 2215*a*, and a Type-C ground contact (A12) 2215*b*, housed within the plastic spring contact holder 2250 on the underside of the mounting bracket 2210, according to some embodiments. The USB connector assembly 2210 also includes the two outer back row extra diagnostic contacts (2230*a*, 2230*b*) that are located next to the Type-C ground contact (A1, A12) 2215*a*, 2215*b*.

Figure 23:
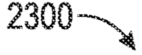
FIG. 23 is a layout diagram of a PCB pad footprint of a PCB for connection to a USB Type-C specification connector, depicting extra PCB diagnostic surface pads for connection to outer back row extra diagnostic contacts of the USB Type-C connector, according to some embodiments.
Figure 23:
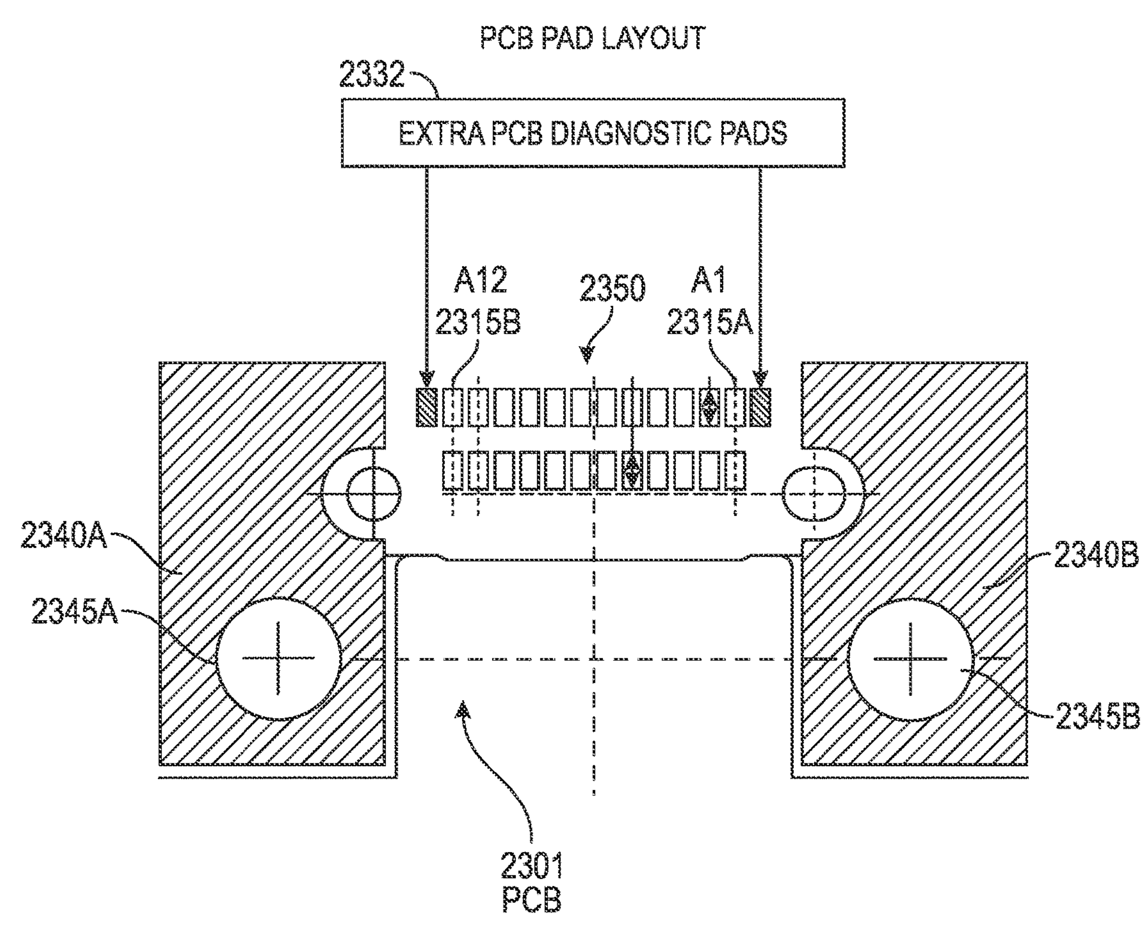

FIG. 23 is a layout diagram of a PCB pad footprint 2300 of a PCB for connection to a USB Type-C specification connector, depicting extra PCB diagnostic surface pads 2332 for connection to outer back row extra diagnostic contacts (2230*a*, 2230*b*) of the USB Type-C connector assembly 2210, according to some embodiments. In some embodiments, the spring contacts of the USB Type-C connector assembly 2210 are configured to electrically connect to corresponding ones of a plurality of electrical contact pads 2350 of the PCB 2301, where an individual spring contact of the plurality of spring contacts applies a contact force to a corresponding one of the electrical contact pads of the PCB upon assembly of the mounting bracket onto the PCB. When the USB connector assembly 2210 is fully seated on a PCB, the outer back row extra diagnostic contacts (2230*a*, 2230*b*) make contact with extra PCB diagnostic surface pads 2332 on the PCB 2301. FIG. 23 depicts the electrical contact pads, including a Type-C ground contact pad (A1) 2315*a*, and a Type-C ground contact pad (A12) 2315*b*, that are located next to the extra PCB diagnostic surface pads 2332. FIG. 23 also depicts screw holes (2345*a*, 2345*b*) in the PCB that align with the screw holes of the USB Type-C connector assembly 2210, in order for the USB Type-C connector assembly 2210 to be screwed into the PCB. 2340*a* and 2340*b* depict some regions of the PCB 2301 that do not have electrically conductive material, and so are electrically isolated from the extra PCB diagnostic surface pads 2332.

Figures 24A, 24B:
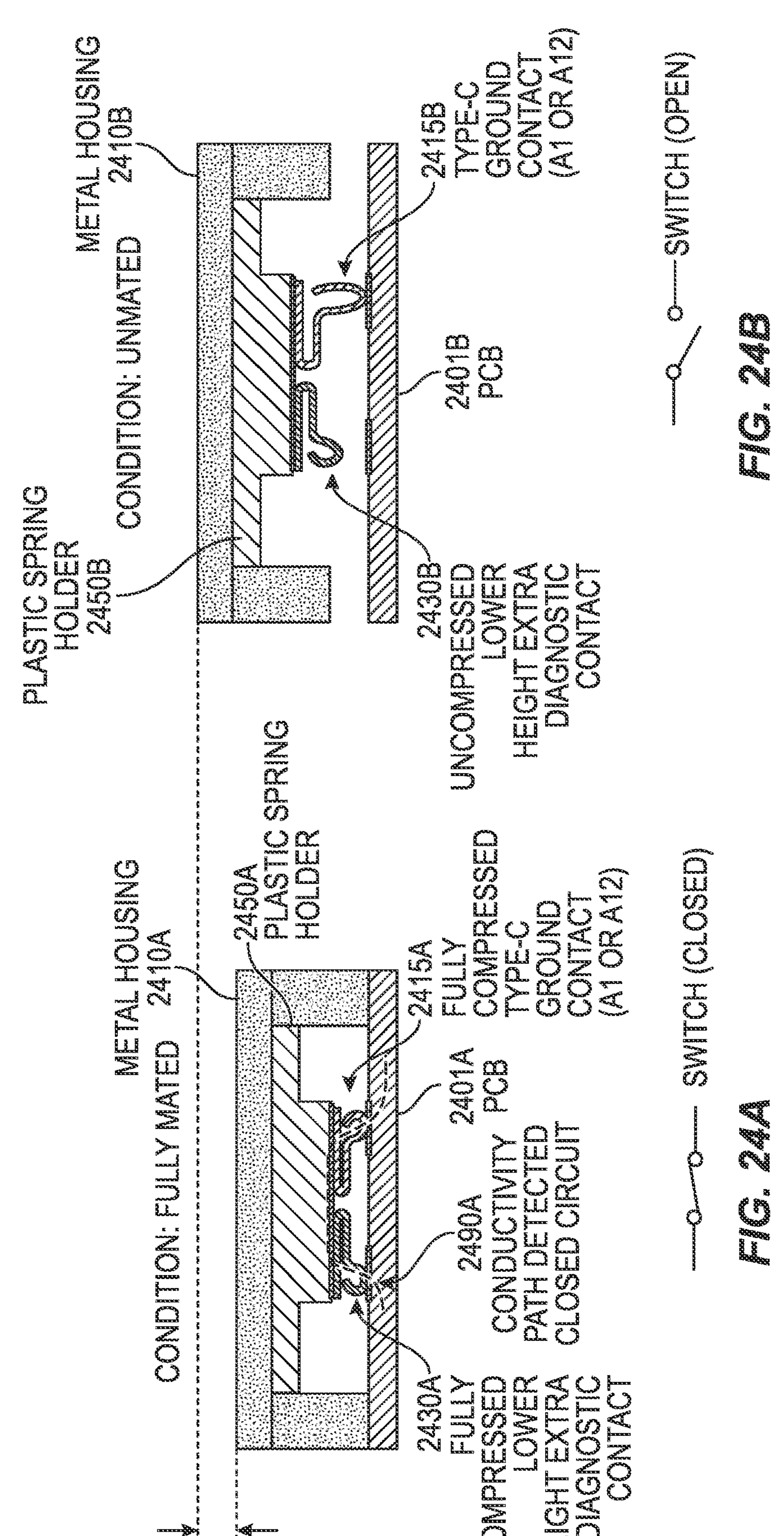
FIG. 24A is a diagram depicting a USB connector assembly with a metal housing fully mated to a PCB such that the outer back row extra diagnostic contacts form a conductivity path with a Type-C ground contact pad (A1 or A12) of the USB connector assembly, according to some embodiments.
FIG. 24B is a diagram depicting a USB connector assembly with a metal housing unmated to a PCB, such that the outer back row extra diagnostic contacts do not form a conductivity path with the Type-C ground contact pad (A1 or A12) of the USB connector assembly, according to some embodiments.

FIG. 24A is a diagram depicting a USB connector assembly with a metal housing 2410*a* fully mated to a PCB 2401*a* such that the outer back row extra diagnostic contacts (2430*a*) form a conductivity path 2490*a* with the Type-C ground contact pad (A1 or A12) 2415*a* of the USB connector assembly, according to some embodiments. The outer back row extra diagnostic contacts (2430*a*) are located next to the Type-C ground contact pad (A1 or A12) 2415*a* of the USB connector assembly. The USB connector assembly includes the spring contacts housed within a plastic spring contact holder 2450*a* on the underside of the mounting bracket 2410*a*, according to some embodiments. When the USB connector assembly is fully seated, an electrical trace 2490*a* goes through the PCB 2401*a*, through an extra PCB diagnostic surface pad 2332, through the outer back row extra diagnostic contacts (2430*a*), across a connection to the Type-C ground contact pad (A1 or A12) 2415*a* of the USB connector assembly, in order to complete a loop, according to some embodiments. Therefore, the electrical circuit of the USB connector assembly is closed, as depicted by the "switch (closed)" text and circuit diagram of FIG. 24A.

FIG. 24B is a diagram depicting a USB connector assembly with a metal housing 2410*b* unmated to a PCB 2401*b*, such that the outer back row extra diagnostic contacts (2430*b*) do not form a conductivity path with the Type-C ground contact pad (A1 or A12) 2415*b* of the USB connector assembly, according to some embodiments. The outer back row extra diagnostic contacts (2430*b*) are located next to the Type-C ground contact pad (A1 or A12) 2415*b* of the USB connector assembly. The USB connector assembly includes the spring contacts housed within a plastic spring contact holder 2450*b* on the underside of the mounting bracket, that would also be unmated to the PCB diagnostic surface pads 2350 of the PCB 2401*b*, according to some embodiments. If the USB connector assembly is at least between 0.15 and 0.24 mm from the PCB 2401*b*, then it becomes unmated. In FIG. 24B, when the USB connector assembly is not fully seated, there is no conductivity path 2490*b* through the PCB 2401*b*, through an extra PCB diagnostic surface pad 2332, through the outer back row extra diagnostic contacts (2430*b*), across a connection to the Type-C ground contact pad (A1 or A12) 2415*b* of the USB connector assembly, in order to complete a loop, according to some embodiments. Therefore, the electrical circuit including the outer back row extra diagnostic contacts (2430*b*) of the USB connector assembly is open, as depicted by the "switch (open)" text and circuit diagram of FIG. 24B.

Figure 25:
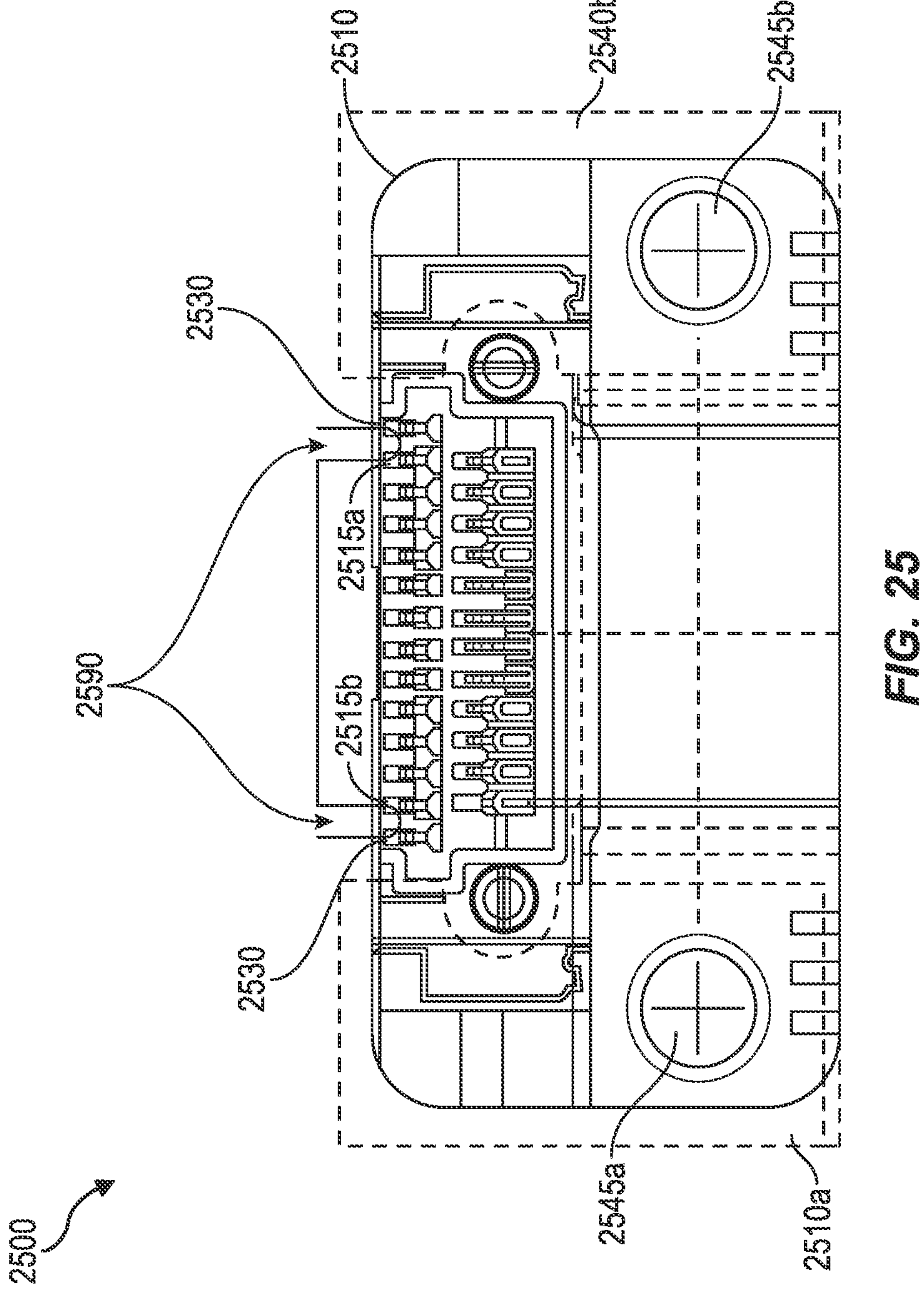
FIG. 25 is an overlay diagram of a USB connector assembly placed on a PCB pad footprint of a PCB, depicting an outer back row diagnostic contact conductivity path continuity, with the outer back row extra diagnostic contacts of the USB connector assembly fully seated on the PCB, according to some embodiments.

FIG. 25 is an overlay diagram 2500 of a USB connector assembly 2510 placed on a PCB pad footprint (2540*a*, 2540*b*) of a PCB, depicting an outer back row extra diagnostic contact conductivity path continuity 2590, with the outer back row extra diagnostic contacts 2530 of the USB connector assembly 2510 fully seated on the extra PCB diagnostic surface pad of the PCB, according to some embodiments. In some embodiments, the spring contacts (2530, 2515*a*, 2515*b*) of the USB Type-C connector assembly 2510 are configured to electrically connect to corresponding ones of a plurality of electrical contact pads of the PCB, where an individual spring contact of the plurality of spring contacts applies a contact force to a corresponding one of the electrical contact pads of the PCB upon assembly of the mounting bracket onto the PCB. FIG. 25 also depicts screw holes (2545*a*, 2545*b*) in the PCB that align with the screw holes of the USB Type-C connector assembly 2510, in order for the USB Type-C connector assembly 2510 to be screwed into the PCB. 2540*a* and 2540*b* depict some regions of the PCB that do not have electrically conductive material, and so are electrically isolated from the extra PCB diagnostic surface pads. When the USB connector assembly 2510 is fully seated, an electrical trace 2590 goes through the PCB, through an extra PCB diagnostic surface pad, through an outer back row extra diagnostic contact 2530 of the USB connector assembly 2510, and across a connection to the Type-C ground contact pad (A1 or A12) 2515*a*, 2515*b* of the USB connector assembly, in order to complete a loop, according to some embodiments.

To implement various operations described herein, computer program code (i.e., program instructions for carrying out these operations) may be written in any combination of one or more programming languages, including an object-oriented programming language such as Java, Smalltalk, Python, C++, or the like, conventional procedural programming languages, such as the "C" programming language or similar programming languages, or any of machine learning software. These program instructions may also be stored in a computer readable storage medium that can direct a computer system, other programmable data processing apparatus, controller, or other device to operate in a particular manner, such that the instructions stored in the computer readable medium produce an article of manufacture including instructions which implement the operations specified in the block diagram block or blocks.

Program instructions may also be loaded onto a computer, other programmable data processing apparatus, controller, or other device to cause a series of operations to be performed on the computer, or other programmable apparatus or devices, to produce a computer implemented process such that the instructions upon execution provide processes for implementing the operations specified in the block diagram block or blocks.

Modules implemented in software for execution by various types of processors may, for instance, include one or more physical or logical blocks of computer instructions, which may, for instance, be organized as an object or procedure. Nevertheless, the executables of an identified module need not be physically located together but may include disparate instructions stored in different locations which, when joined logically together, include the module and achieve the stated purpose for the module. Indeed, a module of executable code may be a single instruction, or many instructions, and may even be distributed over several different code segments, among different programs, and across several memory devices.

Similarly, operational data may be identified and illustrated herein within modules and may be embodied in any suitable form and organized within any suitable type of data structure. Operational data may be collected as a single data set or may be distributed over different locations including over different storage devices.

Reference is made herein to "configuring" a device or a device "configured to" perform some operation(s). This may include selecting predefined logic blocks and logically associating them. It may also include programming computer software-based logic of a retrofit control device, wiring discrete hardware components, or a combination of thereof. Such configured devices are physically designed to perform the specified operation(s).

Various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs.

As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

The invention claimed is:

1. A Universal Serial Bus (USB) connector assembly, comprising:

a mounting bracket configured to removably attach to a printed circuit board (PCB) without the use of any solder joints; and a plurality of diagnostic contacts disposed at least in part within the mounting bracket, wherein the diagnostic contacts are configured to electrically connect to corresponding ones of a plurality of electrical diagnostic contact pads of the PCB, wherein an individual diagnostic contact of the plurality of diagnostic contacts applies a force to a corresponding one of the electrical diagnostic contact pads of the PCB when the mounting bracket is mated to the PCB, and wherein the diagnostic contacts comprise a conductivity path of a diagnostic circuit when the mounting bracket is mated to the PCB.

2. The USB connector assembly of claim 1, wherein the diagnostic contacts are diagnostic surface pads.

3. The USB connector assembly of claim 2, wherein the diagnostic surface pads are outer rear standoff diagnostic surface pads.

4. The USB connector assembly of claim 1, wherein the diagnostic contacts are diagnostic leaf-springs.

5. The USB connector assembly of claim 4, wherein the diagnostic leaf-springs are laser-welded to the mounting bracket.

6. The USB connector assembly of claim 1, wherein the USB connector assembly comprises a Type-C compression USB connector assembly, and wherein the diagnostic contacts are outer back row extra diagnostic contacts.

7. The Type-C compression USB connector assembly of claim 6, wherein at least one of the outer back row extra diagnostic contacts forms a conductivity path with a Type-C ground contact, in the A1 or A12 position, of the Type-C compression USB connector assembly.

8. The USB connector assembly of claim 1, wherein the conductivity path of the diagnostic circuit allows for a connectivity determination of the mounting bracket to the PCB.

9. The USB connector assembly of claim 1, further comprising:

a host USB connector port coupled to the mounting bracket and configured to accept a peripheral USB connector plug.

10. The USB connector assembly of claim 9, wherein the mounting bracket is further configured to secure the host USB connector port to the PCB by compression.

11. The USB connector assembly of claim 1, wherein the mounting bracket comprises one or more screw holes to allow one or more screws to removably attach the USB connector assembly to the PCB.

12. The USB connector assembly of claim 1, further comprising:

a locater component configured to self-register the USB connector assembly on the PCB.

13. A method for diagnosing connectivity with a Universal Serial Bus (USB) connector, comprising:

obtaining a printed circuit board (PCB) comprising a plurality of electrical contact pads on the surface of the PCB for connection to the Universal Serial Bus (USB) connector, wherein the electrical contact pads comprise one or more electrical diagnostic contact pads;

obtaining the USB connector, wherein the USB connector comprises a plurality of spring contacts and one or more diagnostic contacts; and removably attaching the USB connector to the PCB using a fastening component, wherein the plurality of spring contacts of the USB connector electrically connect to corresponding ones of the plurality of electrical contact pads of the PCB, wherein the one or more diagnostic contacts electrically connect to the one or more electrical diagnostic contact pads, and wherein the one or more diagnostic contacts comprise a conductivity path of a diagnostic circuit when electrically connected to the one or more electrical diagnostic contact pads.

14. The method of claim 13, wherein the USB connector comprises a USB compression Type-C connector.

15. The method of claim 13, wherein the one or more diagnostic contacts comprise at least one of: diagnostic surface pads, diagnostic leaf-springs, or outer back row extra diagnostic contacts.

16. The method of claim 13, further comprising:

analyzing a USB connector connectivity detection signal of the diagnostic circuit, wherein the USB connector connectivity detection signal comprises a first value when the USB connector is mated to the PCB, and wherein the USB connector connectivity detection signal comprises a second value when the USB connector is not mated to the PCB; and determining that the USB connector is mated to the PCB based, at least in part, on the analyzing of the USB connector connectivity detection signal.

17. The method of claim 14, further comprising:

analyzing a USB connector connectivity detection signal of the diagnostic circuit;

determining that the USB connector is not mated to the PCB based, at least in part, on the analyzing of the USB connector connectivity detection signal; and based, at least in part, on the determination that the USB connector is not mated to the PCB:

detaching the fastening component;

decoupling the USB connector from the PCB; and replacing the USB connector without replacing the PCB.

18. A printed circuit board assembly, comprising:

a printed circuit board (PCB); and one or more electrical diagnostic contact pads on the surface of the PCB for connection to one or more diagnostic contacts of a Universal Serial Bus (USB) connector;

wherein the printed circuit board assembly is configured to removably mate to the USB connector; wherein the USB connector comprises the one or more diagnostic contacts electrically connected to the one or more electrical diagnostic contact pads, and wherein the one or more diagnostic contacts comprise a conductivity path of a diagnostic circuit when the USB connector is mated to the PCB.

19. The PCB assembly of claim 18, wherein the one or more diagnostic contacts comprise at least one of: diagnostic surface pads, diagnostic leaf-springs, or outer back row extra diagnostic contacts.

* * * * *